(12) United States Patent
Usui

(10) Patent No.: US 7,195,335 B2
(45) Date of Patent: Mar. 27, 2007

(54) LIQUID MEMBER EJECTING DEVICE AND METHOD THEREFOR, ELECTRO-OPTIC DEVICE AND MANUFACTURING METHOD THEREFOR

(75) Inventor: Takahiro Usui, Shiojiri (JP)

(73) Assignee: Seiko Epson Corporation (JP)

( * ) Notice: Subject to any disclaimer, the term of this patent is extended or adjusted under 35 U.S.C. 154(b) by 283 days.

(21) Appl. No.: 10/685,348

(22) Filed: Oct. 14, 2003

(65) Prior Publication Data

US 2004/0135858 A1 Jul. 15, 2004

(30) Foreign Application Priority Data

Oct. 17, 2002 (JP) ............................. 2002-302989
Aug. 26, 2003 (JP) ............................. 2003-301296

(51) Int. Cl.
B41J 2/165 (2006.01)
B41J 2/175 (2006.01)
B41J 2/19 (2006.01)

(52) U.S. Cl. ............................. 347/30; 347/85; 347/92
(58) Field of Classification Search .................. 347/23, 347/29, 30, 36, 84–86, 92, 67
See application file for complete search history.

(56) References Cited

U.S. PATENT DOCUMENTS 5,920,330 A * 7/1999 Ikezaki ..................... 347/33
6,036,299 A * 3/2000 Kobayashi et al. ........... 347/30
6,766,817 B2 7/2004 Silva

FOREIGN PATENT DOCUMENTS

JP 7-266575 10/1995
JP 2000-108383 4/2000
JP 2000-127455 5/2000

OTHER PUBLICATIONS

Patent Abstracts of Japan, 07-266575 (2 pages).
Communication from Korean Patent Office re: related application.

* cited by examiner

*Primary Examiner*—Stephen Meier
*Assistant Examiner*—Geoffrey Mruk
(74) *Attorney, Agent, or Firm*—Harness, Dickey & Pierce, P.L.C.

(57) ABSTRACT

A liquid member ejecting device comprises an ejecting head and a liquid member tank for storing a liquid member and supplying the liquid member to the ejecting head. The liquid member ejecting device further comprises an attracting member for covering nozzles, a first decompressing section which is connected to the first attracting section for decompressing inside of the ejecting head via the first attracting member, a second attracting member for covering the nozzles, and a second decompressing section which is connected to the second attracting member so as to decompress inside of the ejecting head via the second attracting member and inside of the liquid member tank while communicating the liquid member tank. By doing this, it is possible to provide a liquid member ejecting device and method therefor, an electro-optic device, and manufacturing method therefor, and an electronic apparatus which can prevent the manufacturing cost from increasing due to the wasteful use of the liquid member so as to remove bubbles from the ejecting head while realizing a smaller nozzle diameter and finer flow paths.

7 Claims, 15 Drawing Sheets

FIG. 12A
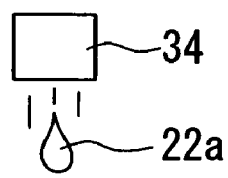
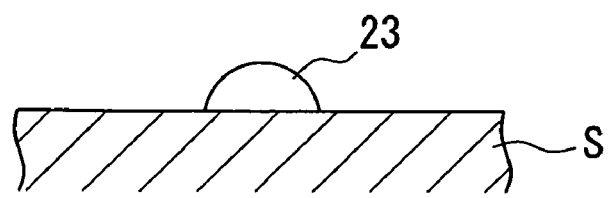
FIG. 12B
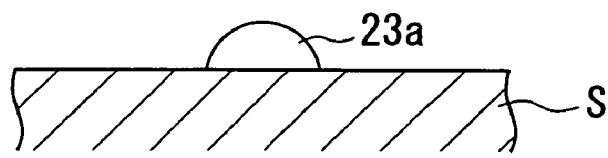
FIG. 12C
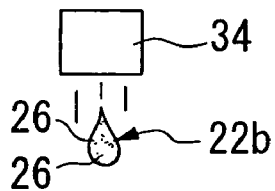
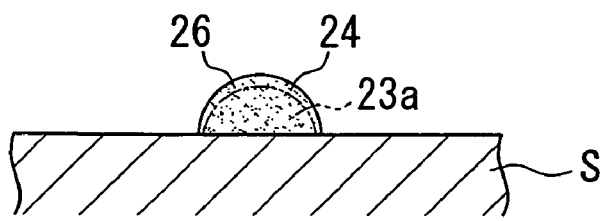
FIG. 12D
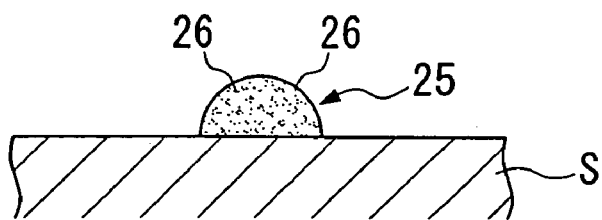

LIQUID MEMBER EJECTING DEVICE AND METHOD THEREFOR, ELECTRO-OPTIC DEVICE AND MANUFACTURING METHOD THEREFOR

CROSS REFERENCE TO RELATED APPLICATIONS

Priority is claimed to Japanese Patent Application No. 2003-301296, filed Aug. 26, 2003, which is hereby incorporated by reference.

BACKGROUND OF THE INVENTION

1. Field of the Invention

The present invention relates to an ejecting device for ejecting a liquid member. More specifically, the present invention relates to a liquid member ejecting device, a method for ejecting the liquid member, an electro-optic device, and a method for manufacturing therefor, and an electronic apparatus which can fill a liquid member in an ejecting head and remove bubbles in the filled liquid member desirably.

2. Description of Related Art

Conventionally, an ink jet printer which is provided with an ink jet head has been known as an ejecting device which is provided with an ejecting head for ejecting the liquid member material.

An ink jet head which is provided in the ink jet printer usually comprises a cavity for storing the liquid member, nozzles for communicating the cavity, and an ejecting section for ejecting the liquid member stored in the cavity from the nozzles. Also, a tank for storing the liquid member is connected to such an ejecting head so as to supply the liquid member from the liquid member tank to the ejecting head.

Also, recently, the above ink jet head for the ejecting head has been used not only for personal ink jet printer, but also for commercial ejecting devices such as a device for forming parts of various devices. For example, such an ejecting head has been used for forming color filters which are used in illuminating layers, positive hole implantation layers in organic EL (electro-luminescence) devices and a liquid crystal device, and furthermore, metal wirings in various devices, and microlenses.

A method for filling the liquid member for starting the ink jet head is performed in the above ink jet head (see Japanese Unexamined Patent Application, First Publication No. 2000-108383).

First, a flexible covering member is pushed to a nozzle forming surface in the ejecting head so as to cover the nozzle forming surface in an air-tight manner. Next, a decompressing section which is connected to the covering member is started so as to decompress a space between the covering member and the nozzle forming surface.

Accordingly, the inside of the ink jet head is decompressed; thus, a liquid member is supplied from the liquid member tank into the ink jet head. Therefore, the ink jet head is filled with the liquid member. Consequently, the above decompressing operation is maintained; thus, the liquid member is drained toward the covering member by attracting the filled liquid member from the ink jet head. Simultaneously, air in the ejecting head and bubbles remaining in a flow path are attracted and drained toward the covering member.

In such a case, the bubbles remaining in the ejecting head act undesirably for flowing the liquid member and ejecting the liquid member from the nozzles because the bubbles absorb ejection pressure which is generated in ejecting the liquid member. Thus, bubbles remaining in the ejecting head is a major reason for an inferior and deteriorated ejection from the ejecting head.

In a case in which the ejecting device is used for an industrial use, a valuable rare liquid member, or a highly viscous liquid member are often used for various purposes. For example, recently, it is proposed to use a technique which is realized by the above ejecting device (ink jet printer) for producing a test sample for analyzing a genetic structure. However, a reagent and a test sample which are used for producing such a test sample are expensive and rare. Also, a highly viscous reagent and test sample are used for a liquid member for producing an illuminating layer in the organic EL device.

However, when the liquid member is filled to start using the ejection head and draining the liquid member which is filled in the ejecting head so as to remove the bubbles therein, the expensive liquid member is wasted; thus, a production cost may be greatly increased. Also, if a rare liquid material is used, there is a disadvantage in that it is possible only to use small amount of liquid material.

Also, when the highly viscous liquid member is used, the bubbles hardly flow in the liquid member and the liquid member also hardly moves by itself; therefore, it is necessary to drain the liquid member by absorbing the liquid member. Thus, production cost increases because the liquid member is wasted.

Furthermore, finer liquid member has been required in recent years so as to satisfy finer ejection; thus, smaller nozzle diameter and a narrower flow path have been required accordingly. Along with a requirement for such a fine structure, it is difficult to drain the bubbles in a decompressing operation and an attracting operation due to a higher capillary attraction.

SUMMARY OF THE INVENTION

The present invention was made in consideration of the above problems. An object of the present invention is to provide a liquid member ejecting device, a method for ejecting the liquid member, an electro-optic device, and a method of manufacturing therefor, and an electronic apparatus which can prevent the production cost from increasing because of a wasted liquid member and remove the bubbles from the ejecting head easily with a smaller nozzle diameter and a narrower flow path for the liquid member.

A liquid member ejecting device according to the present invention comprises an ejecting head which is provided with a plurality of cavities for storing a liquid member and a plurality of nozzles which communicate to a plurality of the cavities, a plurality of ejecting section for ejecting the liquid member which is stored in a plurality of the cavities from a plurality of the nozzles, a liquid member tank for storing the liquid member so as to supply the liquid member to the ejecting head, a first attracting member which covers a plurality of the nozzles, a first decompressing section which is connected to the first attracting member so as to decompress inside of the ejecting head via the first attracting member, a second attracting member which covers a plurality of the nozzles, and a second decompressing section which is connected to the second attracting member and the liquid member tank so as to decompress inside of the ejecting head via the second attracting member and decompress inside of the liquid member tank.

In the above liquid member ejecting device, the liquid member is filled as follows for starting to use the liquid member ejecting device.

First, a nozzle forming surface on the ejection head is covered by a first attracting member under condition that the nozzles are covered. Consequently, the inside of the ejection head is decompressed by the first decompressing section via the first attracting member; thus, the liquid member is filled in the ejection head.

After the liquid member is filled in the ejecting head in the above manner, the first attracting member is detached from the ejecting head. Consequently, the nozzle forming surface on the ejecting head is covered by the second attracting member under condition that the nozzles are covered. Consequently, while the inside of the liquid member tank is decompressed by the second decompressing section, the inside of the ejecting head is decompressed via the second attracting member.

Accordingly, inside of the liquid member tank and inside of the ejecting head are decompressed; therefore, there is approximately no a difference in compression between the liquid member tank and the ejecting head. By doing this, the liquid member does not flow in the ejecting head from the liquid member tank. Also, the liquid member does not leak from the ejecting head. Therefore, only the bubbles remaining in the ejecting head and an gas which is solved in the liquid member are attracted selectively so as to be removed toward the second decompressing section. By doing this, it is possible to remove bubbles or the likes easily and reliably without leaking the liquid member from the ejecting head wastefully; thus, it is possible to reduce a manufacturing cost.

Also, it is possible to form various structural element by ejecting the liquid member from the ejecting head after the bubbles or the likes are removed reliably.

Also, in a liquid member ejecting device according to the present invention, it is preferable that a liquid member sensor for detecting the liquid member which flows from a plurality of the nozzles is disposed opposite to the ejecting head in the first attracting member.

By doing this, when inside of the ejecting head is decompressed via the first attracting member by the first decompressing section so as to fill the liquid member in the ejecting head, a surplus liquid member flows from the nozzles on the ejection head. It is possible to determine that the liquid member is sufficiently supplied in the ejecting head by detecting the liquid member which flows thereout by the liquid member detecting sensor. Therefore, it is possible to prevent the liquid member from flowing out of the ejecting head by stopping the decompressing operation in the first decompressing section after such detection.

Also, in a liquid member ejecting device according to the present invention, it is preferable that the liquid member tank is provided with a heater for heating the liquid drop which is stored in the liquid member tank.

By doing this, it is possible to decrease viscosity of the liquid member by heating the liquid member; thus, it is possible to flow the liquid member into the ejecting head from the liquid member tank easily. Also, it is possible to accelerate evaporation of the gas which is solved in the liquid member and remove the bubbles or the likes during the decompressing operation by the second decompressing section.

Also, in a liquid member ejecting device according to the present invention, it is preferable that the second attracting member is at least a chamber which contains the ejecting head. In such a case, it is also acceptable if the second decompressing section decompresses the pressure inside of the chamber for the second attracting member so as to be the same as the pressure inside of the liquid member tank.

By doing this, the ejecting head is disposed in the chamber, and the second decompressing section which is connected to the chamber is started; thus, it is possible to attract and remove the bubbles which remain in the ejecting head and the gas which is solved in the liquid member easily. That is, inside of the liquid member tank and inside of the ejecting head are decompressed so as to be the same as each other. Therefore, there is approximately no difference in compression between the liquid member tank and the ejecting head. By doing this, the liquid member does not flow in the ejecting head from the liquid member tank. Also, the liquid member does not leak from the ejecting head.

Also, in a liquid member ejecting device according to the present invention, it is preferable that the first attracting member and the second attracting member are formed by a common attracting member, and the first decompressing section and the second decompressing section are formed by a common decompressing section.

By dong this, it is possible to switch a decompressing operation in the first decompressing section to a decompressing operation in the second decompressing section by a switching section because inside of the liquid member tank and the decompressing section communicates each other and such a connection can be selectively opened/closed by switching a valve or the like. Therefore, it is possible to organize the device simply.

A method for ejecting a liquid member according to the present invention by using a liquid member ejecting device comprises an ejecting head which is provided with a plurality of cavities for storing a liquid member and a plurality of nozzles which communicate to a plurality of the cavities, a plurality of ejecting section for ejecting the liquid member which is stored in a plurality of the cavities from a plurality of the nozzles, a liquid member tank for storing the liquid member so as to supply the liquid member to the ejecting head, a first attracting member which covers at least a plurality of the nozzles in an air-tight manner which are formed on a nozzle forming surface on the ejecting head, a first decompressing section which is connected to the first attracting member so as to decompress inside of the ejecting head via the first attracting member, a second attracting member which covers a plurality of the nozzles in an air-tight manner which are formed on the nozzle forming surface o the ejecting head, and a second decompressing section which is connected to the second attracting member and the liquid member tank so as to decompress inside of the ejecting head via the second attracting member and decompress inside of the liquid member tank, comprises the steps for covering a plurality of plugged nozzles which are formed on the nozzle forming surface on the ejecting head by the first attracting member, decompressing inside of the ejecting head by the first decompressing section via the first attracting member so as to fill the liquid member in the ejecting head, filling the liquid member in the ejecting head so as to cover a plurality of the plugged nozzles which are formed on the nozzle forming surface on the ejecting head by the second attracting member, decompressing inside of the liquid member tank by the second decompressing section so as to decompress inside of the ejecting head via the second attracting member, and decompressing inside of the ejecting head so as to eject the liquid member from the ejecting head.

According to the above method for ejecting a liquid member, inside of the liquid liquid member tank is decompressed by the second decompressing section, and inside of the ejecting head is decompressed via the second attracting member; thus, there is approximately no difference in pressure in the liquid member tank and in the ejecting head. By doing this, the liquid member does not flow in the ejecting head from the liquid member tank. Also, the liquid member does not leak from the ejecting head. Therefore, only the bubbles remaining in the ejecting head and an gas which is solved in the liquid member are attracted selectively so as to be removed toward the second decompressing section. By doing this, it is possible to remove bubbles or the likes easily and reliably without leaking the liquid member from the ejecting head wastefully; thus, it is possible to reduce a manufacturing cost. Also, it is possible to form various structural element by ejecting the liquid member from the ejecting head after the bubbles or the likes are removed reliably.

An electro-optic device a part of which is formed by a liquid member ejecting device according to the present invention comprises an ejecting head which is provided with a plurality of cavities for storing a liquid member and a plurality of nozzles which communicate to a plurality of the cavities, a plurality of ejecting section for ejecting the liquid member which is stored in a plurality of the cavities from a plurality of the nozzles, a liquid member tank for storing the liquid member so as to supply the liquid member to the ejecting head, a first attracting member which covers at least a plurality of the nozzles which are formed on a nozzle forming surface on the ejecting head in an air-tight manner, a first decompressing section which is connected to the first attracting member so as to decompress inside of the ejecting head via the first attracting member, a second attracting member which covers at least a plurality of the nozzles which are formed on the nozzle forming surface on the ejecting head in an air-tight manner, and a second decompressing section which is connected to the second attracting member and the liquid member tank so as to decompress inside of the ejecting head via the second attracting member and decompress inside of the liquid member tank.

According to the above electro-optic device, as explained above, at least a part of the electro-optic device is formed by a ejecting device which can form various structural elements desirably; therefore, the electro-optic device is highly desirable and desirable. Also, the liquid member does not leak wastefully; thus, it is possible to reduce a manufacturing cost.

A method for manufacturing an electro-optic device a part of which is formed by a liquid member ejecting device according to the present invention comprising an ejecting head which is provided with a plurality of cavities for storing a liquid member and a plurality of nozzles which communicate to a plurality of the cavities, a plurality of ejecting section for ejecting the liquid member which is stored in a plurality of the cavities from a plurality of the nozzles, a liquid member tank for storing the liquid member so as to supply the liquid member to the ejecting head, a first attracting member which covers at least a plurality of the nozzles which are formed on a nozzle forming surface on the ejecting head in an air-tight manner, a first decompressing section which is connected to the first attracting member so as to decompress inside of the ejecting head via the first attracting member, a second attracting member which covers at least a plurality of the nozzles which are formed on the nozzle forming surface on the ejecting head in an air-tight manner, and a second decompressing section which is connected to the second attracting member and the liquid member tank so as to decompress inside of the ejecting head via the second attracting member and decompress inside of the liquid member tank, comprises the steps for covering a plurality of plugged nozzles which are formed on the nozzle forming surface on the ejecting head by the first attracting member, decompressing inside of the ejecting head by the first decompressing section via the first attracting member so as to fill the liquid member in the ejecting head, filling the liquid member in the ejecting head so as to cover a plurality of the plugged nozzles which are formed on the nozzle forming surface on the ejecting head by the second attracting member, decompressing inside of the liquid member tank by the second decompressing section so as to decompress inside of the ejecting head via the second attracting member, and decompressing inside of the ejecting head so as to eject the liquid member from the ejecting head.

According to the above method for manufacturing an electro-optic device, at least a part of the electro-optic device is formed by the ejecting method which can form the various structural elements desirably; therefore, it is possible to manufacture a highly reliable and desirable. Also, it is possible to reduce a manufacturing cost because the liquid member does not leak wastefully.

In the present invention, it is preferable that a part of an electronic apparatus should be formed by the liquid member ejecting device of the present invention or by the method for ejecting the liquid member according to the present invention.

According to the above electro-optic device, a part of structural elements in the electro-optic device is formed by an ejecting device or by an ejecting method which can form various structural elements desirably; therefore, the electro-optic device is reliable and desirable. Also, it is possible to reduce a manufacturing cost because the liquid member does not lead wastefully.

BRIEF DESCRIPTION OF THE DRAWINGS

FIGS. 12A to 12D are views for explaining a method for manufacturing a microlens.

DETAILED DESCRIPTION OF THE INVENTION

The present invention is explained in detail as follows with reference to drawings.

Figure 1:
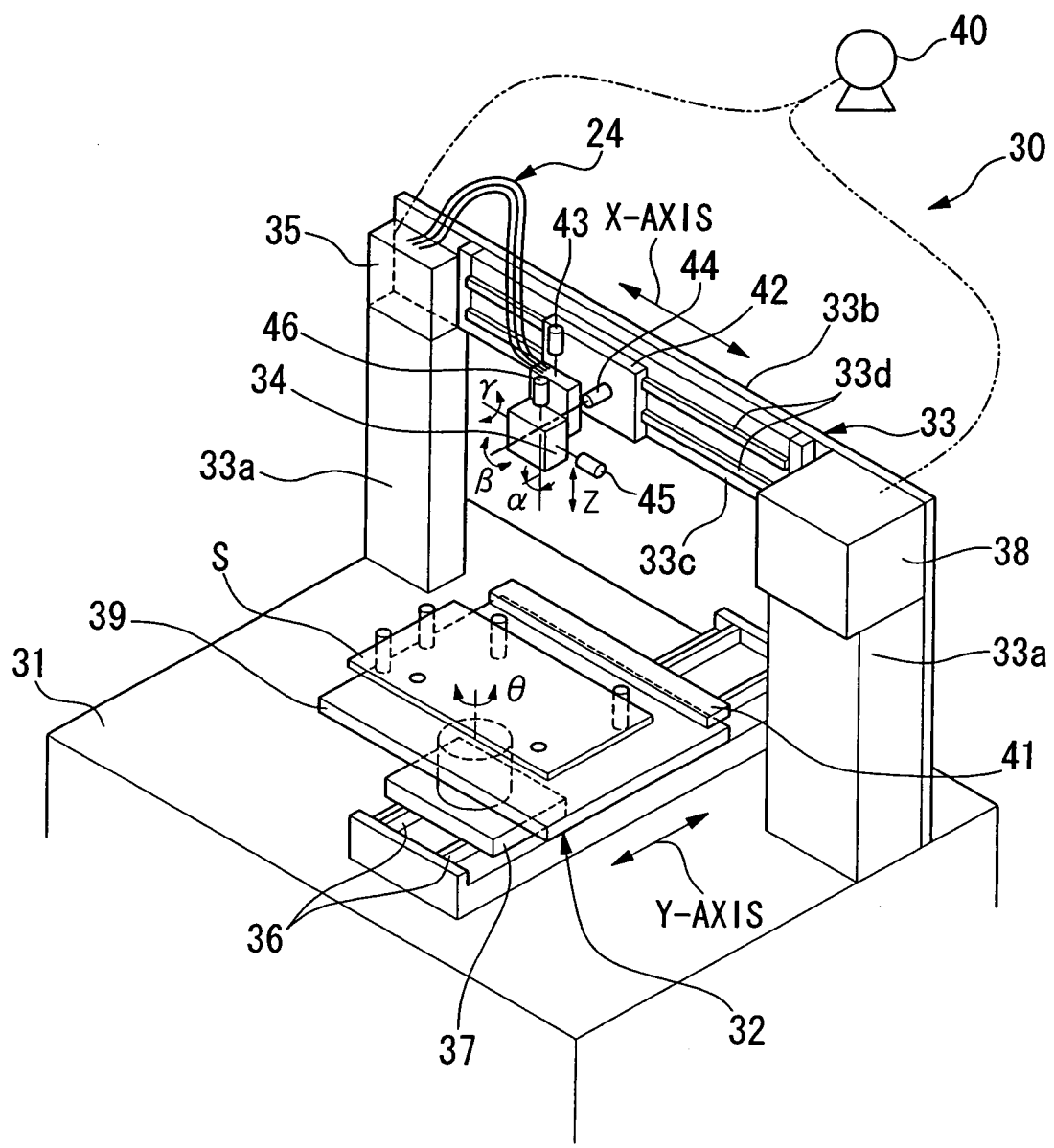
FIG. 1 is a general structure of an ejecting device according to the present invention.

FIG. 1 shows a first embodiment of an ejecting device for liquid member (hereinafter called an ejecting device) of the present invention. In FIG. 1, reference numeral 30 indicates an ejecting device. The ejecting device comprises a base 31, a substrate moving section 32, a head moving section 33, an ejecting head 34, a liquid member tank 35, and a chamber 38.

The base 31 is provided with the substrate moving section 32 and the head moving section 33 thereon.

The substrate moving section 32 is disposed on the base 32. The substrate moving section 32 is provided with a guide rail 36 which is disposed along a Y-axis direction. The substrate moving section 32 is formed so as to move a slider 37 along the guide rail 36 by, for example, a linear motor. The slider 37 is provided with a motor (not shown in the drawing) for a θ axis. The motor is, for example a direct drive motor. A rotor (not shown in the drawing) for the motor is fixed to the table 39. When an electricity is conducted to the motor under the above condition, the rotor and the table 39 rotate in the θ direction; thus the table 39 is indexed.

The table 39 moves a substrate S at a predetermined position and supports the substrate S thereat. That is, the table 39 is provided with an attracting supporting section (not shown in the drawing). The table 39 attracts and supports the substrate S on the table 39 by starting the attracting supporting section. The substrate S is positioned and supported at a predetermined position on the table 39 accurately by a positioning pin (not shown in the drawing) on the table 39. A trial ejection area 41 is formed on the table 39 such that the ejecting head 34 ejects a liquid member for a provisional purpose. The trial ejection area 41 is formed so as to expand in the X-axis direction near a rear end of the table 39.

The head moving section 33 is provided with a pair of carriers 33a and 33a which stand leaning on the base 31 and a running path 33b which is formed on the carriers 33a and 33a. In the carriers 33a and 33a, the running path 33b is disposed in the X-axis direction such that the running path 33b should be disposed in a direction orthogonal to a Y-axis direction in which the substrate moving section 32 moves therealong. The running path 33b is provided with a supporting plate 33c which is disposed between the carriers 33a and 33a and a pair of guide rails 33d and 33d which are disposed on the supporting plate 33c. The running path 33b supports a slider 42 which support the ejecting head 34 so as to freely move in a longitudinal direction in the guide rails 33d and 33d. The slider 42 runs on the guide rails 33d and 33d by starting the linear motor (not shown in the drawing) such that the ejecting head 34 moves in the X-axis direction.

Motors 43, 44, 45, and 46 for swinging and positioning sections are connected to the ejecting head 34. Consequently, when the motor 43 is started, the ejecting head 34 moves vertically along a Z-axis; thus, it is possible to position the ejecting head on the Z-axis. Here, the Z-axis (in vertical direction) is orthogonal to the X-axis and the Y-axis respectively. Also, when the motor 44 is started, the ejecting head 34 is swung along a β direction in FIG. 1; thus, it is possible to be positioned. When the motor 45 is started, the ejecting head 34 is swung in a γ direction; thus, it is possible to be positioned. When the motor 46 is started, the ejecting head 34 is swung in an α direction; thus, it is possible to be positioned.

By doing this, the ejecting head 34 moves linearly in the Z-axis direction on the slider 42; thus, it is possible to position the ejecting head. Also, the ejecting head 34 is swung along the α direction, the β direction, and the γ direction; thus, it is possible to position the ejecting head. Therefore, it is possible to control an ink ejecting surface on the ejecting head 34 accurately. Also, it is possible to control a position of the ejecting head 34 according to the substrate S near the table 39 accurately.

Figure 2A:
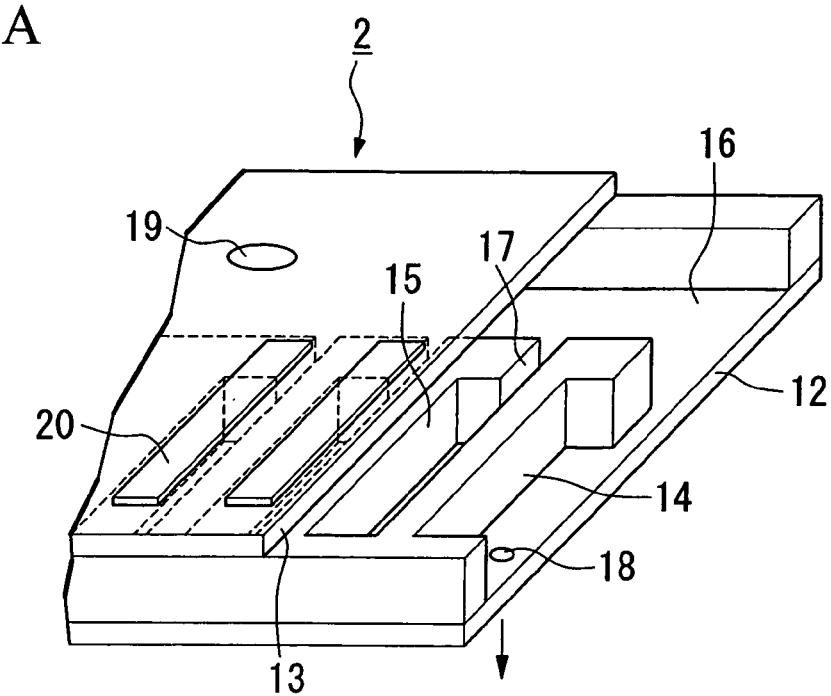
FIGS. 2A and 2B show a general structure of an ejecting head.

Here, the ejecting head 2 is provided with, for example a nozzle plate 12 which is made of a stainless steel and a vibrating plate 13 as shown in FIG. 2A. Both the nozzle plate 12 and the vibrating plate 13 are attached together via a separating member (reservoir plate) 14. A plurality of cavities 15 . . . and the reservoir 16 are formed by the separating member 14 between the nozzle plates 12 and the vibrating plate 13. A plurality of the cavities 15 . . . and the reservoir 16 communicate with each other via a flow path 17.

Inside of the cavities 15 . . . and inside of the reservoir 16 are filled with a liquid member. The flow path 17 which is disposed between the cavities 15 . . . and the reservoir 16 serves as a port for supplying a liquid member from the reservoir 16 to the cavities 15 . . . therethough. Also, a plurality of hole nozzles 18 for ejecting the liquid member from the cavities 15 . . . are formed in vertical and horizontal organized arrays on the nozzle plate 12. On the other hand, an opening hole 19 is formed on the vibrating plate 13 such that the opening hole 19 communicates the reservoir 16. The tank 3 for the liquid member is connected to the hole 19 via a tube 24 (see FIG. 1).

Figure 2B:
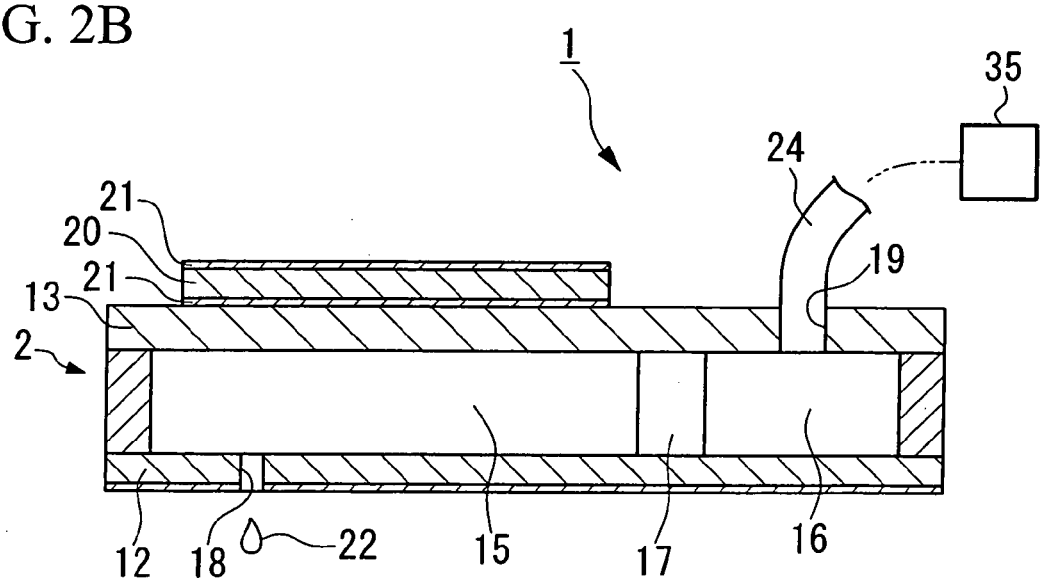

Also, a piezoelectric element 20 is attached on a surface of the vibrating plate 13 opposite to the cavities 15 . . . as shown in FIG. 2B. The piezoelectric element 20 is disposed so as to be supported between a pair of electrodes 21 and 21 such that the piezoelectric element 20 bends so as to protrude toward thereoutside when an electricity is conducted there so as to serve for an ejecting section in the present invention. By doing this, the vibrating plate 13 to which the piezoelectric element 20 attached bends to protrude toward thereoutside unitarily with the piezoelectric element 20; thus, a volume in the cavities 15 . . . increases. Accordingly, when inside of the cavities 15 . . . and inside of the reservoir 16 communicate each other and the liquid member is filled in the reservoir 16, a corresponding amount of the increased liquid member flows in the cavities 15 . . . from the reservoir 16 via the flow path 17.

Consequently, when an electric conductance to the piezoelectric element 20 is released under the above condition, the piezoelectric element 20 and the vibrating plate 13 recover to their initial shape. Therefore, the volume in the cavities 15 . . . recovers to its initial volume; thus, a pressure in the liquid member in the cavities 15 . . . increases, accordingly, a liquid drop 22 is ejected from the nozzle 18.

Here, an ejecting section in the ejecting head is not limited to an electric-mechanical converting member which uses the above piezoelectric element 20. For example, it is possible to employ various methods such as a method in which an electric-thermal converting member is used for an energy generating element, a continuous method such as an electrification controlling method or a pressing vibrating method, an electrostatic absorbing method, and a method in which a liquid member is ejected by a heat generated by emitting an electromagnetic wave such as a laser.

The liquid member tank 35 is disposed on a carrier 33a. Inside of the liquid member tank 35 is connected to a vacuum pump 40 via a tubing section (not shown in the drawing).

Also, a heater (not shown in the drawing) is disposed in the liquid member tank 35. It is acceptable if the heater is disposed outside the liquid member tank 35. The heater heats the stored liquid member. In particular, in a case in which the liquid member is highly viscous, the heater heats the liquid member so as to reduce the viscosity in the liquid member such that the liquid member should be flown into the ejecting head 34 from the liquid member tank 35 easily. By doing this, it is also possible to accelerate a evaporation of the gas which is dissolved in the liquid member and to remove the bubbles easily in a decompressing operation by the second decompressing section, as explained later.

Here, the carrier 33a supports the running path 33b; the carrier 33a is positioned sufficiently close to the ejecting head 34 which runs on the running path 33b. Therefore, a tube 24 for sending the liquid member from the liquid member tank 35 to the ejecting head 34 is sufficiently short; that is, the length of the tube 24 is approximately the same as the length of the running path 33b.

Also, the above chamber 38 is disposed on other carrier 33a. The chamber 38 is a second attracting member in the present invention. As explained later, the chamber 38 covers the nozzle 18 on the ejecting head 34 by containing the ejecting head 34 in an air tight manner. Also, the above vacuum pump 40 is connected to the chamber 38. Here, the vacuum pump 40 is a second decompressing section in the present invention. That is, the vacuum pump 40 is connected to the liquid member tank 35 via a tubing section (not shown in the drawing) as explained above; therefore, by doing this, it is possible to decompress both inside of the chamber 38 and inside of the liquid member tank 35 simultaneously such that the decompressed pressure in both inside of the chamber 38 and inside of the liquid member tank 35 should be about the same.

Here, a door (not shown in the drawing) is disposed in the chamber 38. The injecting head 34 enters the chamber 38 via the door after the ejecting head 34 runs in the X-axis direction by the head moving section 33 near the chamber 38. The ejecting head 34 is contained in the chamber 38 in an air tight member by closing the door.

Figure 3:
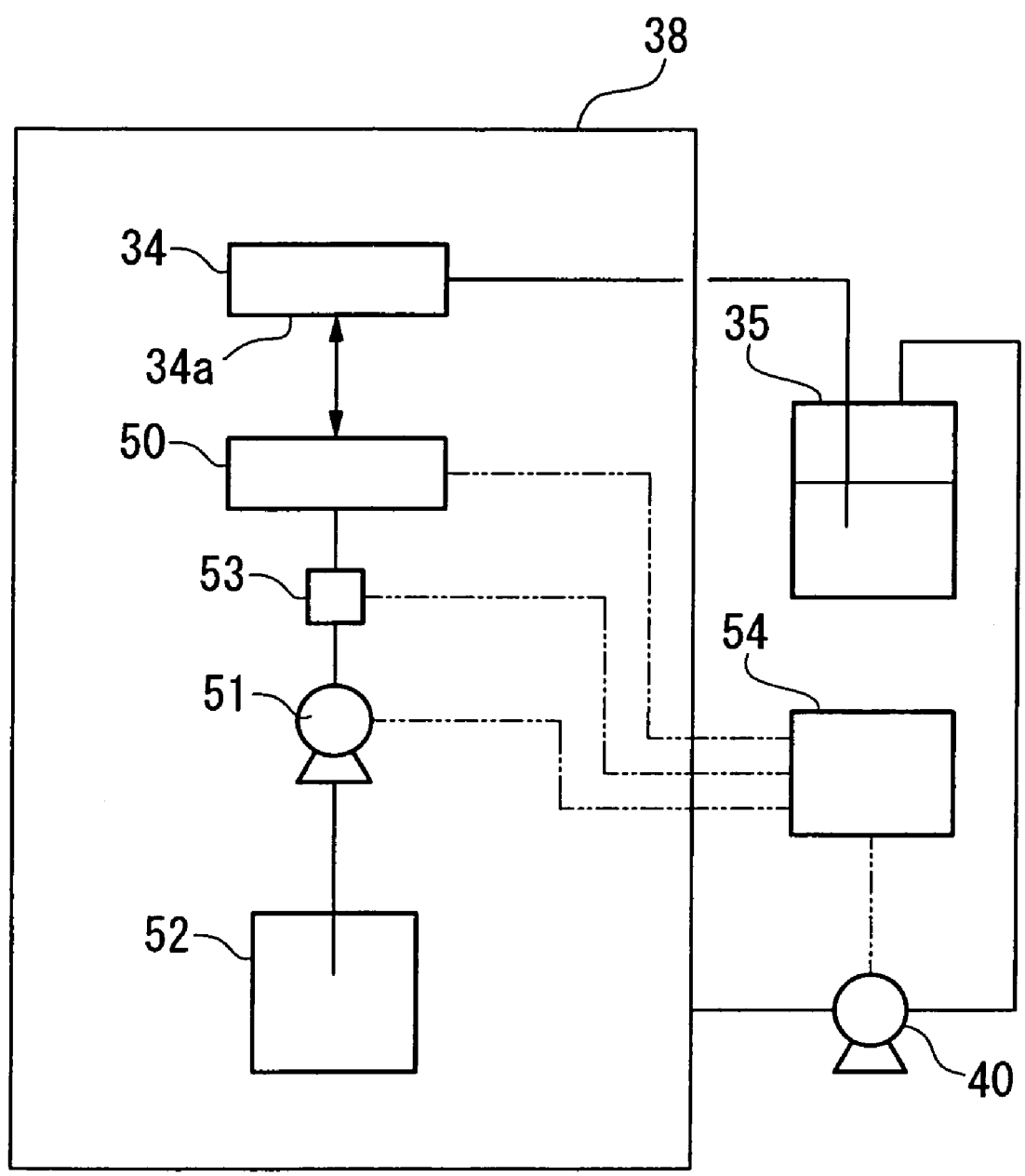
FIG. 3 shows an essential part in the ejecting device shown in FIG. 1.

As shown in FIG. 3, an attracting pad 50 which covers a surface (nozzle forming surface) 34a on which a nozzle 18 is formed on the ejecting head 34 in an air tight manner, an suction pump 51 which is connected to the attracting pad 50, and a waste liquid member tank 52 are disposed in the chamber 38. The attracting pad 50 serves for the first attracting member in the present invention. The attracting pad 50 comprises a pad which contacts the nozzle forming surface 34a on the ejecting head 34 so as to cover thereof, a flexible tube (not shown in the drawing) which communicates to a hole section (not shown in the drawing) which is formed on the pad, and a moving structure which moves the pad toward the ejecting head 34 so as to contact the ejecting head 34 and retracts the pad therefrom. Here, the pad is made of a rubber or a soft synthetic resin.

The suction pump 51 serves for the first decompressing section in the present invention. The attracting pad 50 performs a decompressing operation after the pad on the attracting pad 50 contact the nozzle forming surface 34a on the ejecting head 34 so as to decompress inside of the ejecting head 34 via the attracting pad 50.

Here, a liquid member sensor 53 for detecting the liquid member is disposed between the suction pump 51 and the attracting pad 50. A sensor which has been known conventionally is used selectively according to the liquid member type for such a liquid member sensor 53. For example, when the liquid member is a non-light-transmitting liquid member, it is possible to use a sensor which is provided with an illuminating element and a light-receiving element.

That is, a transparent section is formed in a tube section which connects the suction pump 51 and the attracting pad 50. Consequently, the above illuminating element and the light receiving element are disposed on both sides of the transparent section. By doing this, a light which is emitted from the illuminating element can be received by the light receiving element when the liquid member does not pass the transparent section; thus, the liquid member is not detected. Also, a light which is emitted from the illuminating element is blocked by the liquid member when the liquid member passes. Thus, a light is not received by the light receiving element; therefore, the liquid member is detected.

The waste liquid member tank 52 stores a surplus liquid member which leaks from the ejecting head 34 when inside of the ejecting head 34 is decompressed by the suction pump 51 via the attracting pad 50. Here, in the present embodiment, a liquid member sensor 53 is disposed between the attracting pad 50 and the suction pump 51 as explained above. More importantly, it is acceptable if a liquid member sensor be disposed in the waste liquid member tank 52 according to the liquid member type. In such a case, it is acceptable if it is detected whether or not a predetermined amount of surplus liquid member leaks from the ejecting head 34 by monitoring a surface level of the liquid member stored in the waste liquid member tank 52 by a level sensor.

Also, the attracting pad 50, the suction pump 51, the liquid member detecting sensor 53, and the vacuum pump 40 are connected to a controlling device 54 respectively. Operations in the attracting pad 50, the suction pump 51, the liquid member detecting sensor 53, and the vacuum pump 40 are controlled by the controlling device 54 respectively.

Next, an example for a method for ejecting the liquid member according to the present invention is explained as follows based on operations in the ejecting device 30 which has the above structure. Here, it should be understood that explanation is made under condition that the liquid member is not limited to a particular liquid member; that is, it is possible to use any liquid member in the present invention.

First, before ejecting the liquid member to a substrate S, the liquid member is filled in the ejecting head 34. Simultaneously, the ejecting head 34 is moved and contained in the chamber 38 so as to remove the bubble which remains in the liquid member.

Next, the attracting pad 50 is moved by controlling the controlling device 54 such that the attracting pad 50 contact the nozzle forming surface 34a on the ejecting head 34, and the attracting pad 50 is covered in an air tight manner. Consequently, the suction pump 51 is started so as to decompress inside of the ejecting head 34 via the attracting pad 50. Under such a condition, the vacuum pump 40 has not yet been started; therefore, a pressure inside of the liquid member tank 35 is an atmospheric pressure. In such a case, there is a difference in a pressure between inside of the liquid member tank 35 and inside of the ejecting head 34 which is connected to the attracting pad 50. Due to such a pressure difference, the liquid member stored in the liquid member tank 35 flows into the ejecting head 34; thus, the ejecting head 34 is filled with the liquid member. Here, it is acceptable if the stored liquid member be heated by conducting an electricity to the heater (not shown in the drawing) which is disposed in the liquid member tank 35 before starting the suction pump 51.

Consequently, the liquid member is continued to be supplied to the ejecting head 34 by the suction pump 51, the ejecting head 34 is sufficiently filled by the liquid member. After that, the surplus liquid member leaks from the nozzle 18 on the ejecting head 34. The leaking liquid member is detected by the liquid member detecting sensor 53; therefore, it is detected that the ejecting head 34 is filled with the liquid member sufficiently. Consequently, when a detection signal is sent to the controlling device 54, the controlling device 54 which receives the detection signal stops the suction pump 51 and stops the liquid member which flows from the liquid member tank 35 to the ejecting head 34. By doing this, after it is confirmed that the liquid member is filled in the ejecting head 34 and the liquid member further leaks from the ejecting head and the chamber 38 is under air tight condition, the vacuum pump 40 is started by the controlling device 54.

Accordingly, the ejecting head 34 is contained in the chamber 38. As a result of this, the nozzle forming surface 34*a* is covered by the second attracting member such as the chamber 38 in the present invention in air tight manner. Therefore, the inside of the ejecting head 34 is attracted and decompressed by the vacuum pumkp 40 via the chamber 38 (second attracting member).

Also, inside of the chamber 38 and inside of the liquid member tank 35 are decompressed so as to be at the same pressure; thus, there is approximately no a difference in compression between the liquid member tank 35 and the ejecting head 34. By doing this, the liquid member does not flow in the ejecting head 34 from the liquid member tank 35. Also, the liquid member does not leak from the ejecting head 34. Therefore, only the bubbles remaining in the ejecting head 34 and an gas which is solved in the liquid member are attracted selectively so as to be removed toward the chamber 38.

By doing this, after the bubble which remain in the ejecting head 34 and an gas which is solved in the liquid member are removed selectively, the vacuum pump 40 is stopped by the controlling device 54, and an atmosphere valve (not shown in the drawing) which is disposed in the chamber 38 is released; thus, pressure in the chamber 38 and the pressure in the liquid member tank 35 recover to the atmosphere pressure.

Here, the decompressing operation in the chamber 38 and in the liquid member tank 35 by the vacuum pump 40 is not limited to a specific method. However, more importantly, it is preferable that the decompressing operation should be performed for 1 to 3 minutes from a productivity point of view. Also, although a decompression (vacuum) condition depends on the liquid member, more importantly, a decompression (vacuum) condition should preferably be in a range of 0.1 Pa to 0.5 Pa so as to remove the bubbles effectively in the above decompressing operation for such a period. This is because it is difficult to remove bubbles sufficiently within the above period if the pressure in higher than 0.5 Pa. Also, it is not possible to anticipate that the bubble be removed effectively when the pressure is lower than 0.1 Pa.

After that, the ejecting head 34 is extracted from the chamber 38 so as to be at an ordinary position for an ejecting operation; thus, the liquid member is ejected onto the substrate S.

According to the above method for ejecting the liquid member by using the ejecting device 30, inside of the liquid member tank 35 and inside of the ejecting head 34 are decompressed by the vacuum pump 40 after the liquid member is filled in the ejecting head 34. Therefore, the liquid member does not flow in the ejecting head 34 from the liquid member tank 35. Also, the liquid member does not leak from the ejecting head 34. Therefore, it is possible to remove the bubbles remaining in the ejecting head 34. Therefore, it is possible to remove bubbles easily and reliably without leaking the liquid member from the ejecting head 34 wastefully; thus, it is possible to reduce a manufacturing cost. Also, the liquid member is ejected from the ejecting head after bubble is removed reliably; therefore, it is possible to form various structural elements by ejecting the liquid member desirably.

Next, a second embodiment of the ejecting device according to the present invention is explained as follows. The second embodiment is different from the first embodiment in that the first attracting member (attracting pad 50) and the second attracting member (chamber 38) are formed by the same attracting member as each other, and furthermore, the first decompressing section (suction pump 51) and the second decompressing section (vacuum pump 40) are formed by the same decompressing section as each other.

Figure 4:
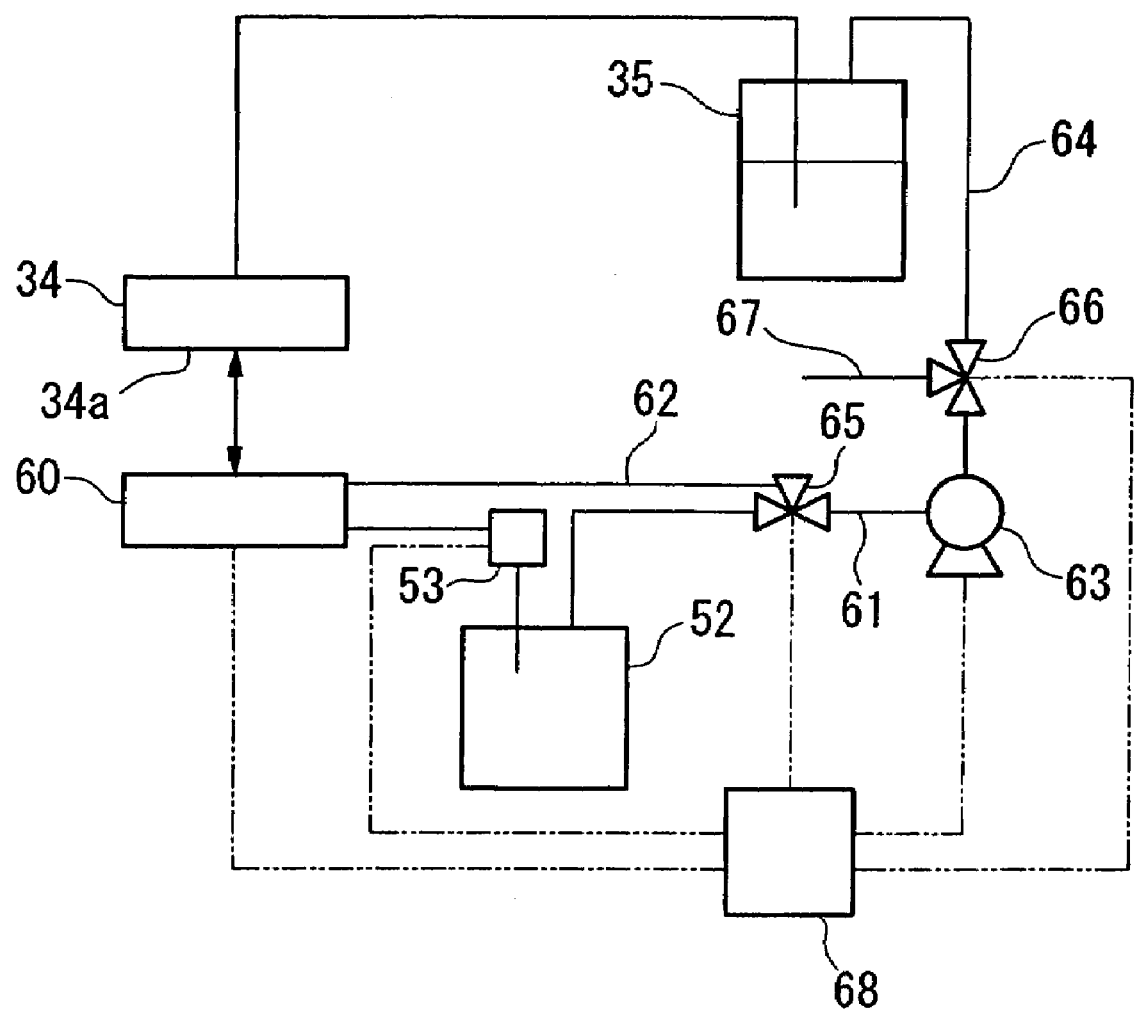
FIG. 4 shows an essential part in other ejecting device.

That is, in the second embodiment, the chamber 38 is not disposed. In the second embodiment, an attracting pad 60 is disposed instead of the chamber 38 as shown in FIG. 4. Furthermore, a vacuum pump 63 is connected to the attracting pad 60 via a tubing section 61 and a divided tube section 62. The attracting pad 60 serves the first decompressing member and the second decompressing member in the present invention compatibly. The attracting pad 60 is the same as the attracting pad 50 in the first embodiment. That is, as explained above, the attracting pad 60 comprises a pad which contacts the nozzle forming surface 34*a* on the ejecting head 34 so as to cover the nozzle forming surface 34*a*, a flexible tubing section (not shown in the drawing) which communicates to a hole section (not shown in the drawing) which is formed on the pad, and a moving structure which moves the pad toward the ejecting head 34 so as to contact the ejecting head 34 and separate therefrom.

Also, the vacuum pump 63 serves as the first decompressing section and the second decompressing section. The vacuum pump 63 is the same as the vacuum pump 40 in the first embodiment. That is, the vacuum pump 63 is connected to the attracting pad 60. Simultaneously, the vacuum pump 63 is connected to the liquid member tank 35 via the tubing section 64.

The liquid member detecting sensor 53 and the waste liquid member tank 52 are disposed in the tubing section 61 which connects the vacuum pump 63 and the attracting pad 60. The liquid member detecting sensor 53 and the waste liquid member tank 52 are the same as those in the first embodiment. By doing this, when a surplus liquid member leaks from the ejecting head 34, the liquid member detecting sensor 53 detects the leak of the surplus liquid member. A three-way valve 65 is disposed in the tubing section 61. The tubing section 61 is divided to a divided tubing section 62 between the three-way valve 65 and the attracting pad 60.

On the other hand, a three-way valve 66 is disposed in a path of a tubing section 64 which connects the vacuum pump 63 and the liquid member tank 35. By doing this, a flow path from the liquid member tank 35 which is connected to the vacuum pump 63 is switched to a divided tubing section 67 which is released to an atmosphere; thus, a flow path from the liquid member tank 35 is released to the atmosphere.

Here, the attracting pad 60, the vacuum pump 63, the liquid member detecting sensor 53, the three-way valve 65, and the three-way valve 66 are connected to a controlling device 68 respectively. Operations in the attracting pad 60, the vacuum pump 63, the liquid member detecting sensor 53, the three-way valve 65, and the three-way valve 66 are controlled by the controlling device 68 respectively.

Next, an example for other method for ejecting the liquid member according to the present invention is explained as follows based on operations in the ejecting device which has the above structure. Here, it should also be understood that explanation is made under condition that the liquid member is not limited to a particular liquid member; that is, it is possible to use any liquid member in the present invention.

First, before ejecting the liquid member to a substrate S, the liquid member is filled in the ejecting head 34. Simultaneously, the ejecting head 34 is moved near the attracting pad 60 so as to remove the bubble which remains in the liquid member.

Also, the controlling device 68 controls the three-way valve 65 such that a flow path which connects the attracting pad 60 and the vacuum pump 63 communicates the liquid member detecting sensor 53. Also, the controlling device 68 controls the three-way valve 66 such that the liquid member tank 35 should be released to the atmosphere via the divided tubing section 67.

Next, the attracting pad 60 is moved by controlling the controlling device 68 such that the attracting pad 60 contact the nozzle forming surface 34a on the ejecting head 34, and the attracting pad 60 is covered in an air tight manner. Consequently, the vacuum pump 63 is started so as to decompress inside of the ejecting head 34 via the attracting pad 60. Under such a condition, a pressure inside of the liquid member tank 35 is an atmosphere pressure; therefore, there is a difference in a pressure between inside of the liquid member tank 35 and inside of the ejecting head 34 which is connected to the attracting pad 60. Due to such a pressure difference, the liquid member stored in the liquid member tank 35 flows into the ejecting head 34; thus, the ejecting head 34 is filled with the liquid member.

Consequently, the liquid member is continued to be supplied to the ejecting head 34 by the vacuum pump 63, the ejecting head 34 is sufficiently filled by the liquid member. After that, the surplus liquid member leaks from the nozzle 18 on the ejecting head 34. The leaking liquid member is detected by the liquid member detecting sensor 53; therefore, it is detected that the ejecting head 34 is filled with the liquid member sufficiently. Consequently, when a detection signal is sent to the controlling device 68, the controlling device 68 which receives the detection signal switches the three-way valves 65, and 66 respectively such that a flow path between the attracting pad 60 and the vacuum pump 63 should pass the divided tubing section 62, and the liquid member tank 35 should communicate to the vacuum pump 63.

By switching the three-way valves 65 and 66, inside of the ejecting head 34 and inside of the liquid member tank 35 are decompressed by the vacuum pump 63 so as to be the same as each other. Therefore, there is approximately no difference in compression between the ejecting head 34 and the liquid member tank 35. By doing this, the liquid member does not flow in the ejecting head 34 from the liquid member tank 35. Also, the liquid member does not leak from the ejecting head 34. Therefore, as similarly to the first embodiment, particularly only bubble which remains in the ejecting head 34 and the gas which is solved in the liquid member are attracted selectively so as to be removed toward the vacuum pump 63 via the attracting pad 60.

By doing this, after the bubble which remain in the ejecting head 34 and an gas which is solved in the liquid member are removed selectively, the vacuum pump 63 is stopped by the controlling device 68, and the attracting pad 60 is separated from the ejecting head 34.

Here, it should be understood that the decompressing condition such as a decompressing period and decompressing pressure in the ejecting head 34 and the liquid member tank 35 by the vacuum pump 63 would be the same as those performed in the first embodiment.

After that the ejecting head 34 is moved to a proper position for performing an ejecting operation so as to eject the liquid member onto the substrate S.

According to the above method for ejecting the liquid member, inside of the liquid member tank 35 and inside of the ejecting head 34 are decompressed by the vacuum pump 63 after the liquid member is filled in the ejecting head 34. Therefore, the liquid member does not flow in the ejecting head 34 from the liquid member tank 35. Also, the liquid member does not leak from the ejecting head 34. Therefore, it is possible to remove the bubbles remaining in the ejecting head 34. Therefore, it is possible to remove bubbles easily and reliably without leaking the liquid member from the ejecting head 34 wastefully; thus, it is possible to reduce a manufacturing cost. Also, the liquid member is ejected from the ejecting head after bubble is removed reliably; therefore, it is possible to form various structural elements by ejecting the liquid member desirably.

Various modification can be made also within a scope of essential features of the present invention. For example, in the above first embodiment, it is acceptable if the liquid member tank 35 is disposed in the chamber 38, and furthermore, the liquid member tank 35 is released in the chamber 38. By doing this, when the vacuum pump 40 is started, it is possible to decompress inside of the ejecting head 34 and in side the liquid member tank 35 via the chamber 38 so as to be the same pressure as each other. Also, it is acceptable if the overall ejecting device may be contained in a large chamber instead of containing the ejecting head 34 in the chamber 38 such that the ejecting head can be freely taken out and entered thereinto.

Also, in the second embodiment, it is acceptable if, for example, an attracting pad for the first attracting member and an attracting pad for the second attracting member are prepared, and/or a vacuum pump for the first decompressing section and a vacuum pump for the second decompressing section are prepared respectively; thus, a liquid member filling operation and a removing operation for bubble are performed separately by switching the above structure.

Also, in any of the above embodiments, it is acceptable if an ejecting device be formed without disposing a liquid member detecting sensor 53 therein. In such a case, a condition such as a time for filling the liquid member in side the ejecting head 34 by the first attracting member sufficiently should be found in advance by an experiment. After that, the decompressing operation and the attracting operation should be performed by the first attracting member under the above condition. Consequently, the decompressing operation should be performed by the second attracting member.

Also, in the above ejecting device, it is possible to form any desirable stractural element for an electro-optic device by selecting a liquid member preferably. For example, it is possible to form various elements which form an electro-optic device by using a liquid member such as a metal colloid which is a raw material for an organic EL element and a metal wiring, and various material such as a microlens material, a color filter material, and a liquid crystal material.

Also, it is possible to use the above ejecting device for forming a Surface-Conduction Electron-Emitter Display (hereinafter called an SED.

Next, a method for manufacturing an electro-optic device according to the present invention is explained.

First, a method for manufacturing an organic EL device is explained as an example for forming a structural element for an electro-optic device.

Figure 5:
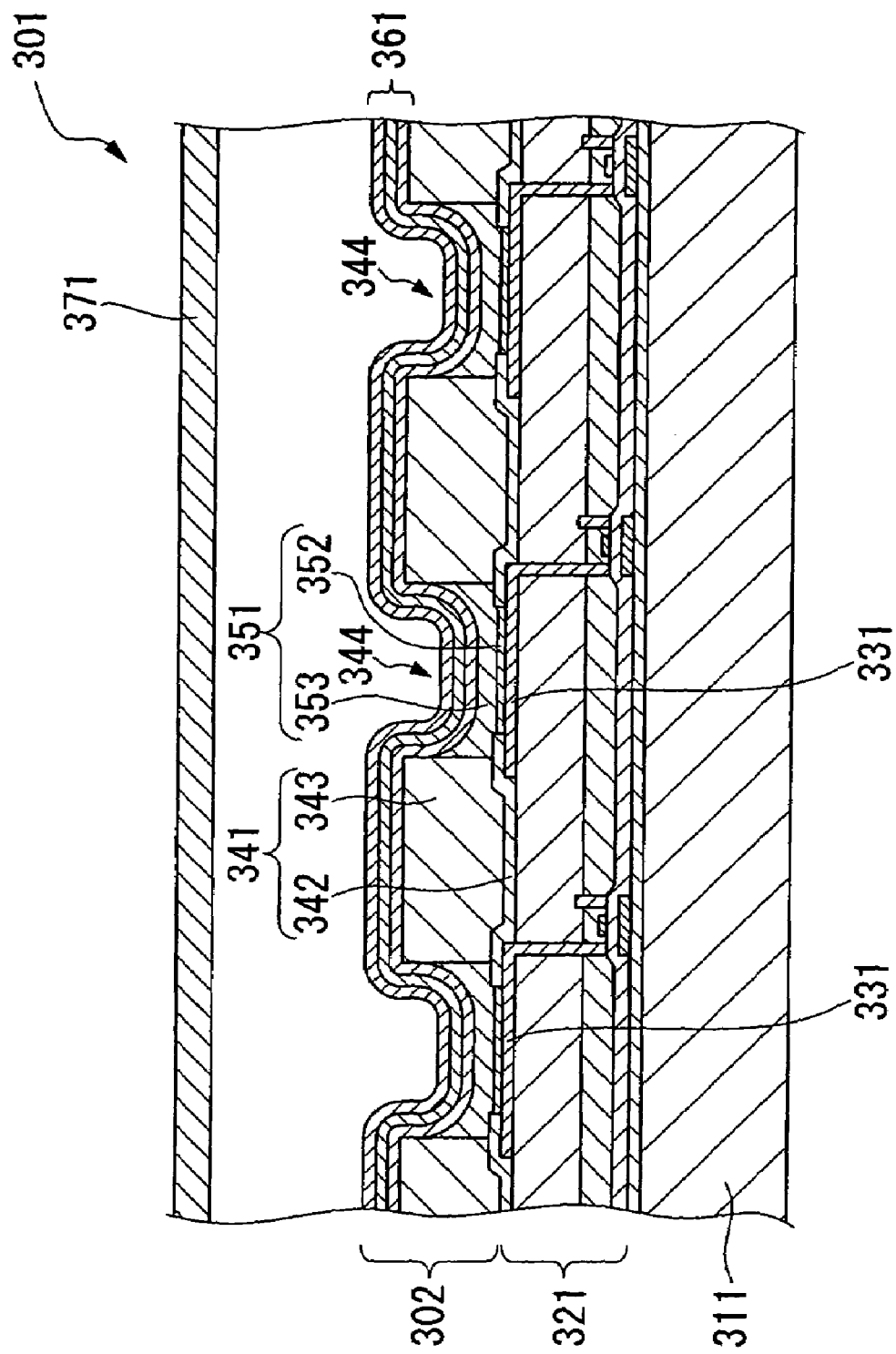
FIG. 5 is a cross section for an organic EL device.

FIG. 5 is a cross section of an organic EL device a part of which is manufactured by the above ejecting device. First, a general structure of the electro-optic device is explained. Here, the electro-optic device which is formed here is an embodiment of the electro-optic device according to the present invention.

As shown in FIG. 5, the electro-optic device 301 is formed by connecting an organic EL element 302 to a wiring in a flexible substrate (not shown in the drawing) and a driving IC (not shown in the drawing) such that the electro-optic device 301 comprises a substrate 311, a circuit element section 321, pixel electrodes 331, bank sections 341, illuminating elements 351, a cathode 361 (facing electrode), and a sealing substrate 371. The circuit element section 321 is formed on the substrate 311 such that a plurality of pixel electrodes 331 are formed on the circuit element section 321 in arrays in an organized manner. Consequently, the bank sections 341 are formed between the pixel electrodes 331 in a lattice form. The illuminating elements 351 are formed in concave apertures 344 which are made by the bank sections 341. The cathode 361 is formed on an overall surface on the bank sections 341 and the illuminating pixels 351. A sealing substrate 371 is layered on the cathode 361.

A method for manufacturing an organic EL device including the organic EL element comprises the steps for forming a bank section which forms the bank section 341, performing a plasma treatment for forming the illuminating element 351 appropriately, forming an illuminating element for forming the illuminating element 351, forming a facing electrodes for forming a cathode 361, and sealing the cathode 361 by layering the sealing substrate 371 thereon.

In the illuminating element forming step, an illuminating element 351 is formed by forming a positive hole implantation layer 352 and an illuminating layer 353 on the concave aperture 344 for a pixel electrode 331. The illuminating element forming step comprises a positive hole implantation layer forming step and the illuminating layer forming step. Furthermore, the positive hole implantation layer forming step comprises a first ejecting step in which a first compound (liquid member) for forming the positive hole implantation layer 352 is ejected on the pixel electrodes 331 and a first drying step in which the ejected first compound is dried so as to form the positive hole implantation layer 352. The illuminating layer forming step comprises a second ejecting step in which a second compound (liquid member) for forming the illuminating layer 353 is ejected on the positive hole implantation layer 352 and a second drying step in which the ejected second compound is dried so as to form the illuminating layer 353.

In the illuminating element forming step, the above ejecting device is used in the first ejecting step in the positive hole implantation layer forming step and in the second ejecting step in the illuminating layer forming step.

It is possible to eject a material for forming the positive hole implantation layer and a material for forming the illuminating layer from the ejecting head 34 desirably by removing bubbles from the ejecting head 34 before the ejection for forming various structural elements for manufacturing the organic EL device 301. Therefore, it is possible to manufacture a more reliable organic EL device.

Next, a method for manufacturing a plasma display is explained for an example for forming the above structural elements.

Figure 6:
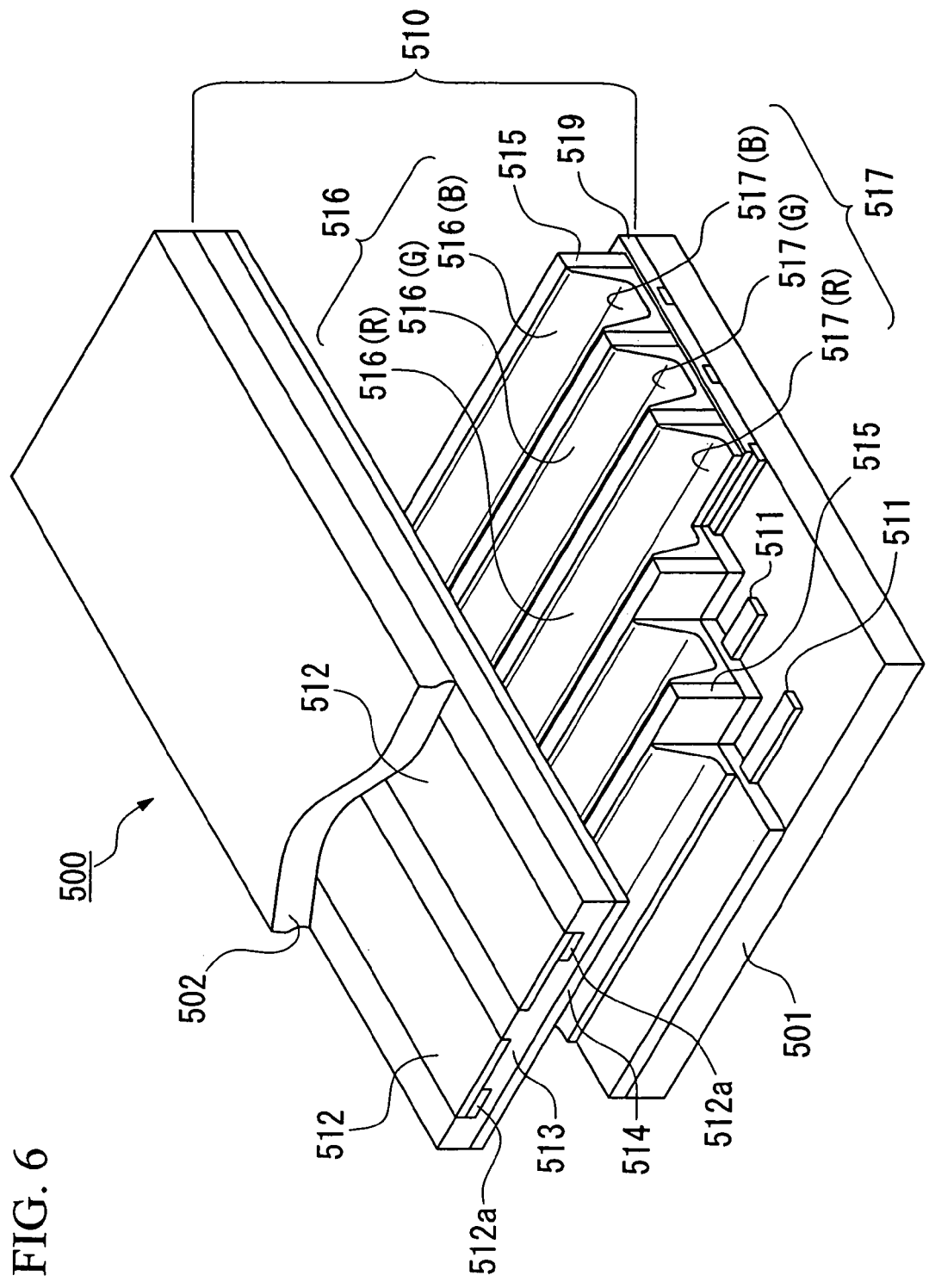
FIG. 6 is an isometric perspective view for a plasma display.

FIG. 6 is a disassembled perspective view for a plasma display a part of which such as address electrodes 511 and bus electrodes 512a are manufactured by the above ejecting device. In FIG. 6, reference numeral 500 indicates a plasma display. The plasma display 500 comprises a pair of glass substrates 501 and 502 which are facing each other, and a discharging display section 510 which is formed between the glass substrates 501 and 502.

The discharged display section 510 is formed by a plurality of charging chambers 516 such that three discharging chambers 516 such as a red color discharging chamber 516(R), a green color discharging chamber 516(G), and a blue color discharging chamber 516(B) form a pixel in a plurality of discharging chambers 516.

A plurality of address electrodes are formed on an upper surface of the above (glass) substrate 501 by a predetermined intervals in stripes. A dielectric layer 519 is formed so as to cover the upper surfaces of the address electrodes 511 and the substrate 501. Furthermore, a plurality of partition walls 515 are formed on the dielectric layer 519 between the address electrodes 511, 511 along the address electrodes 511, 511. Here, the partition walls 515 are separated (not shown in the drawing) by a predetermined interval in a direction orthogonal to the address electrodes 511 in a predetermined position in an longitudinal direction of the partition walls 515. A rectangular area is formed which is separated by partition walls which neighbor both horizontal sides of the address electrodes 511 and partition walls which expand in a direction orthogonal to the address electrodes 511. The discharging chambers 516 are formed so as to correspond to these rectangular areas; thus, three rectangular areas forma a pixel. Fluorescent members 517 are disposed inside of the rectangular areas which are separated by the partition walls 515. The fluorescent members 517 emit any of a color among red, green, or blue. A red color fluorescent member 517(R) is disposed on a bottom of the red color discharging chamber 516(R). A green color fluorescent member 517(G) is disposed on a bottom of the Green color discharging chamber 516(G). A blue color fluorescent member 517(B) is disposed on a bottom of the blue color discharging chamber 516(B).

Next, transparent display electrodes 512 which are made of a plurality of ITO's are formed on the glass substrate 502 so as to be in a direction orthogonal to the address electrodes 511 by a predetermined interval in stripes. Simultaneously, metal bus electrodes 512a are formed so as to compensate highly resistance ITOs. Also, a dielectric layer 513 is formed so as to cover the above structure such that a protecting layer 514 is formed thereon.

Consequently, the substrate 501 and the glass substrate 502 are attached together so as to face each other such that the address electrodes 511 . . . and the display electrodes 512 are disposed so as to be orthogonal each other. A space which is surrounded by the substrate 501, partition walls 515, and the protecting layer 514 which is formed on the glass substrate 502 is evacuated and a rare gas is sealed there instead. By doing this, a discharging chamber 516 is formed. Here, two display electrodes 512 near the glass substrate 502 are disposed in each discharge chamber 516.

The address electrodes 511 and the display electrodes 512 are connected to an alternating power source which is not shown in the drawing such that fluorescent members 517 are excited to be illuminated in the discharging display section 510 in a necessary position so as to perform a color display operation by conducting an electricity to the electrodes.

Additionally, in the present embodiment, the address electrodes 511, the bus electrodes 512a, and the fluorescent members 517 are formed by the above ejecting device 30. That is, the address electrodes 511 and the bus electrodes 512 are formed by ejecting a liquid material (liquid member) in which a metal colloid (for example, a gold colloid, and a silver colloid) and a conductive particle (for example, a metal particle) are dispersed therein so as to be dried and sintered because it is particularly advantageous for performing a patterning operation. Also, the fluorescent member 517 is formed by ejecting a liquid material (liquid member) in which a fluorescent material is solved in a solvent or dispersed in a dispersion medium so as to be dried and sintered.

In order to manufacture the plasma display 500, bubbles are removed from the ejection head 34 in advance before ejecting the liquid member for forming the address electrodes, the bus electrodes 512a, and the fluorescent members 517. By doing this, it is possible to eject a material (liquid material) for forming the electrodes 511, 512a, and the fluorescent members 517 desirably respectively. Therefore, it is possible to form a reliable plasma display.

Next, a method for manufacturing a color filter which is used for a liquid display device is explained for an example for the above structural elements.

First, the substrate S is disposed at a predetermined position on the table 39 so as to manufacture a color filter by ejecting an ink onto the substrate S from the above ejecting device 30. Here, a transparent substrate having appropriate strength and high transparency is used for the substrate S. More specifically, a transparent glass substrate, an acrylic glass, a plastic substrate, a plastic film, and a material made by performing a surface treatment onto the above materials are used.

Also, in the present embodiment, a plurality of color filter regions are formed in matrix manner on the rectangular substrate S from a productivity point of view. The color filter regions can be used for a color filter which is appropriate for the liquid crystal display by cutting the substrate S later. Here, the color filter regions are formed by disposing R (red) ink, G (Green), and B (Blue) ink in a predetermined pattern such as a conventional striped pattern in the present embodiment. Here, it is acceptable if a mosaic pattern, a delta pattern, or a square pattern may be used instead of the striped pattern.

Figure 7:
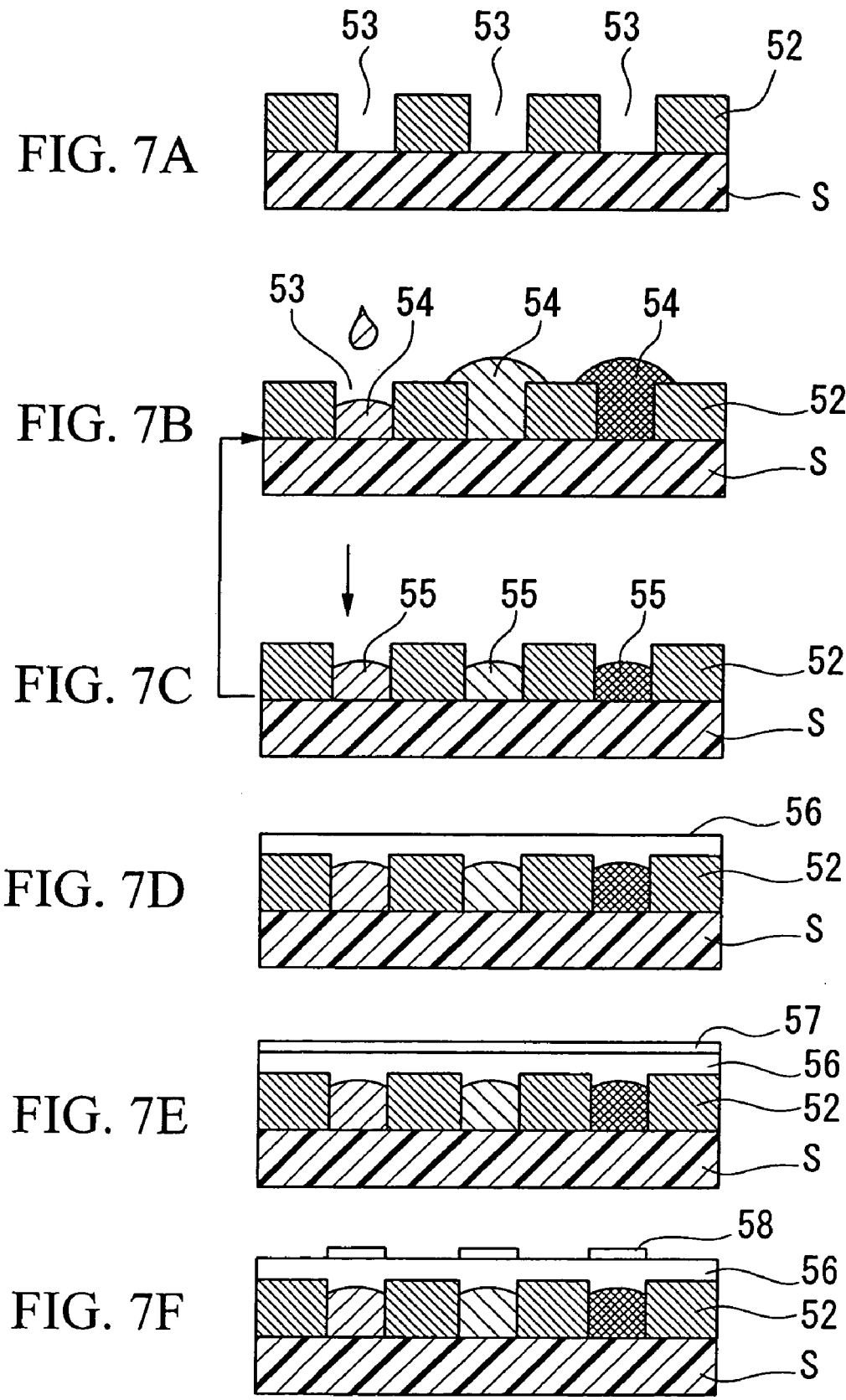
FIGS. 7A to 7F are views for showing a method for forming a color filter.

In order to form such a color filter region, first, as shown in FIG. 7A, black matrixes 52 are formed on surface of the transparent substrate S. The black matrixes 52 are formed by applying a non-transparent resin (preferably a black resin) by a predetermined thickness (for example, approximately 2 μm). Size of a filter element 53 which is a minimum display element surrounded by the black matrixes 52 is formed in 30 μm in width in the X-axis direction and 100 μm in length in Y-axis direction.

Next, as shown in FIG. 7B, an ink droplet (liquid drop) 54 is ejected from the above ink jet head 34 on the filter element 53. Here, appropriate number of the ink droplet 54 should be ejected such that it should be considered that the ink volume may be reduced in a heating process.

After the ink droplets 54 are filled in all of the filter elements 53 on the substrate S, the substrate S is heated by a heater at a predetermined temperature (for example, approximately 70° C.). The volume of the ink is reduced by the heating operation because a solvent in the ink is vaporized. In a case in which volume of the ink is reduced excessively, the ejecting operation and the heating operation are repeated until a desirable thickness of the ink layer for a color filter is formed. By doing this, the solvent contained in the ink is vaporized; thus, only a solid component contained in the ink is solidified so as to remain therein; thus, it is possible to form the color filter 55 shown in FIG. 7C.

Next, in order to form the substrate S flatly and protect the color filter 55, a protecting layer 56 on the substrate S by covering the color filter 55 and the black matrixes 52 as shown in FIG. 7D. Although, it is possible to employ any method such as spin coat method, roll coat method, and a dipping method so as to form the protecting layer 56, it is possible to use the ejecting device 30 as shown in FIG. 1 similarly to a case for the color filter 55.

Next, a transparent conductive layer 57 is formed on an overall surface of the protecting layer 56 by a sputtering method, or a vacuum evaporation method as shown in FIG. 7E. After that, the patterning operation is performed to the transparent conductive layer 57 such that the pixel electrodes 58 should correspond to the filter elements 53.

It is possible to eject the material (ink droplet 54) for forming the color filters 55 from the ejecting head 34 desirably by removing bubbles in the ejecting head 34 in advance before ejecting the ink for forming the color filters 55 when the color filter is manufactured by the ejecting device 30; therefore, it is possible to form a desirable color filter.

Figure 8:
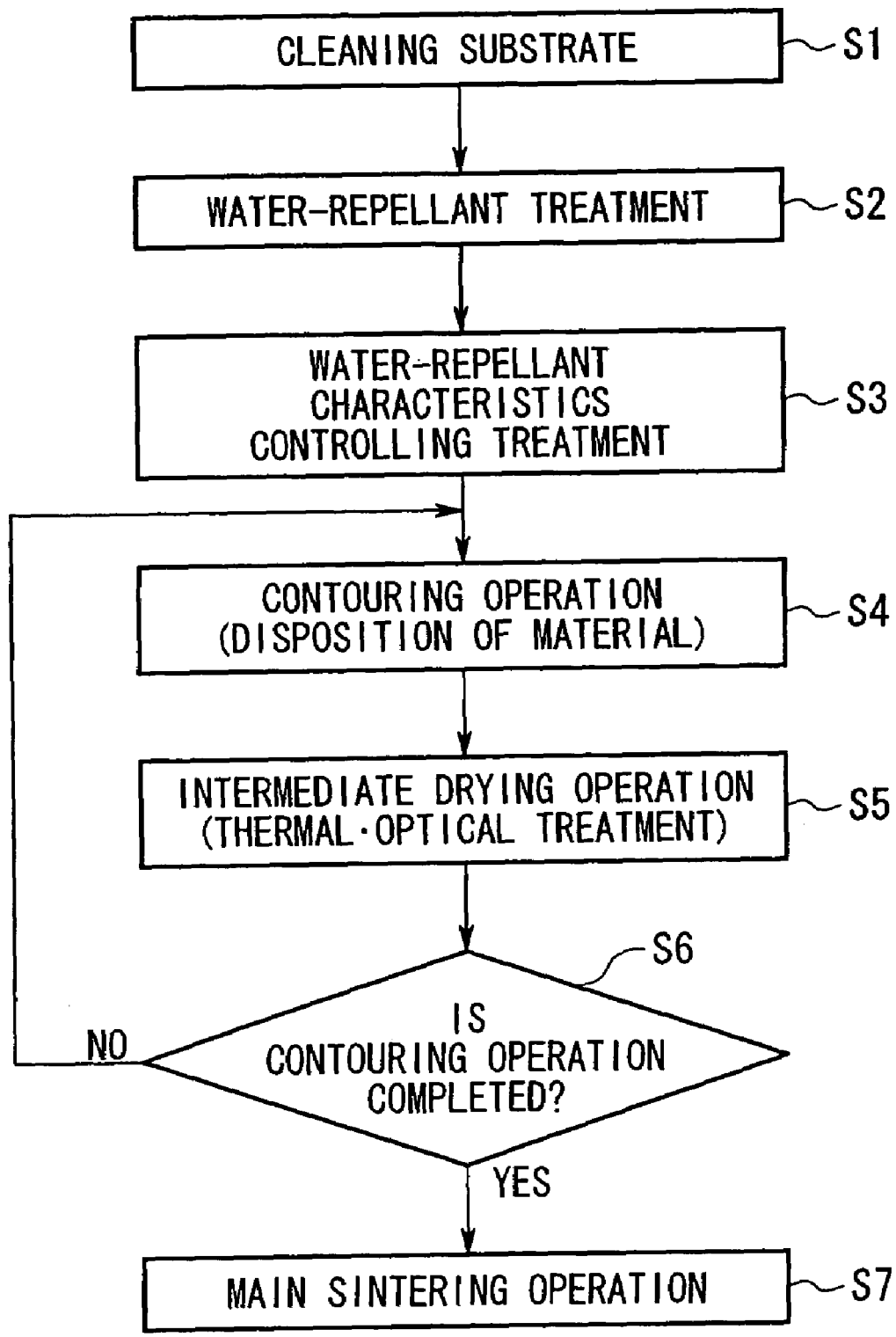
FIG. 8 is a flow chart for explaining a method for forming a pattern.

Next, a method for forming a conductive layer wiring pattern (metal wiring pattern) is explained for an example for forming the above structural elements. FIG. 8 is a flow chart showing an example for a method for forming a conductive layer wiring pattern.

Method for a pattern according to the present embodiment shown in FIG. 8 comprises the steps for cleaning the substrate in which the liquid drops for liquid material is disposed by a predetermined solvent (step 1), performing a water-repellant treatment as a part of a surface treatment for the substrate (step 2), controlling the water-repellency as a part of the surface treatment for adjusting the water-repellency on the surface of the substrate on which the water-repellant treatment is performed (step 3), disposing a material for describing (forming) a layer pattern by disposing a liquid drop for the liquid material which contains a material for forming a conductive wiring according to a method for ejecting the liquid drop on the surface-finished substrate (step 4), performing an intermediate drying operation containing a thermal/optical treatment so as to remove at least a part of a solvent component in the liquid material which is disposed on the substrate (step 5), and sintering the substrate on which a predetermined pattern is described (step 7). Here, whether or not the describing operation for the predetermined pattern is completed is determined (step 6) after the intermediate drying operation; thus, the sintering operation is performed after the describing operation for the pattern is completed. On the other hand, an operation for disposing the material is performed if the describing operation for the pattern is not completed.

Next, a step for disposing the material (step 4) according to a method for ejecting the liquid drop by the ejecting device 30 is explained.

In the step for disposing the material in the present embodiment, a plurality of linear layer pattern(wiring pattern) are formed on the substrate S in organized arrays by disposing the liquid drop for the liquid material containing the material for forming a conductive layer wiring from the liquid drop ejecting head 30 in the ejecting device on the substrate S. The liquid material is a liquid member in which a metal conductive particle as a material for forming the conductive layer wiring is dispersed in a dispersion solvent. Hereinafter, explanations are made under conditions in which three layer patterns such as a first layer pattern (linear patterns) W1, a second layer pattern (linear patterns) W2, and third layer pattern (linear patterns) W3 on the substrates.

In FIGS. 9A, 9B, 10, and 11, an example for an order of disposing the liquid drop on the substrate S in the present embodiment is explained. In these drawings, bit maps which have pixels which are a plurality of unit regions in matrix on which the liquid drop for the liquid material is disposed are disposed on the substrate S. Here, a pixel is formed in a square. Consequently, regions R1, R2, and R3 for forming the first layer pattern W1, the second layer pattern W2, and the third layer pattern W3 are disposed so as to correspond to predetermined pixels. A plurality of the regions R1, R2, and R3 for forming the patterns are disposed in line in the X-axis direction. Here, in the drawings 9A to 11, hatched section indicates the regions R1, R2, and R3 for forming the patterns.

Also, it is arranged such that the liquid drop for the liquid material which is ejected from a first ejecting nozzle 34A among a plurality of ejecting nozzles which are disposed in the ejecting head 34 in the liquid drop ejecting device is disposed in the region R1 for forming the first layer pattern on the substrate S. Similarly, it is arranged such that the liquid drop for the liquid material which is ejected from a second ejecting nozzle 34B and a third ejecting nozzle 34C among a plurality of the ejecting nozzles which are disposed in the ejecting head 10 in the liquid drop ejecting device is disposed in regions 2 and 3 for forming the second layer pattern and the third layer pattern on the substrate S. That is, the ejecting nozzles (ejecting sections) 34A, 34B, and 34C are disposed so as to correspond to the regions R1, R2, and R3 for forming the first layer pattern W1, the second layer pattern W2, and the third layer pattern W3. Consequently, it is arranged such that the ejecting head 34 disposes a plurality of liquid drops to a plurality of pixel positions in the regions R1, R2, and R3 for forming the patterns as arranged. The first layer pattern W1, the second layer pattern W2, and the third layer pattern W3 which are supposed to be formed in the regions R1, R2, and R3 for forming these patterns are formed in first side patterns Wa which is an end surface of (−X direction) in a width direction in each of the regions R1, R2, and R3 for forming the first layer pattern W1, the second layer pattern W2, and the third layer pattern W3. Consequently, a second side patterns Wb are formed on the other end in the width direction (+X direction). After the first end section patterns Wa and the second end section patterns Wb are formed, it is arranged such that a central patterns Wc should be formed in a central region in the width direction.

In the present embodiment, it is arranged such that the layer patterns (linear patterns) W1 to W3 and the regions R1 to R3 for forming these patterns have the same width L as each other and the width L is the same as three pixels. Also, the space sections between the patterns are set so as to be the same width S as each other. The width S is set to be the same as three pixels. Additionally, a nozzle pitch for an interval among the ejecting nozzles 34A to 34C is set so as to correspond to six pixels.

Hereinafter, the explanations are made under condition that the ejecting head 34 which is provided with the ejecting nozzles 34A, 34B, and 34C ejects the liquid drop while scanning in the Y-axis direction toward the substrate S. Also, in the explanations with reference to FIGS. 9A to 11, "1" indicates a liquid drop which is disposed in the first scanning operation. Also, "2" indicates a liquid drop which is disposed in the second scanning operation, and "3" indicates a liquid drop which is disposed in the third scanning operation. Thus, "n" indicates a liquid drop which is disposed in $n^{th}$ scanning operation.

Figure 9A:
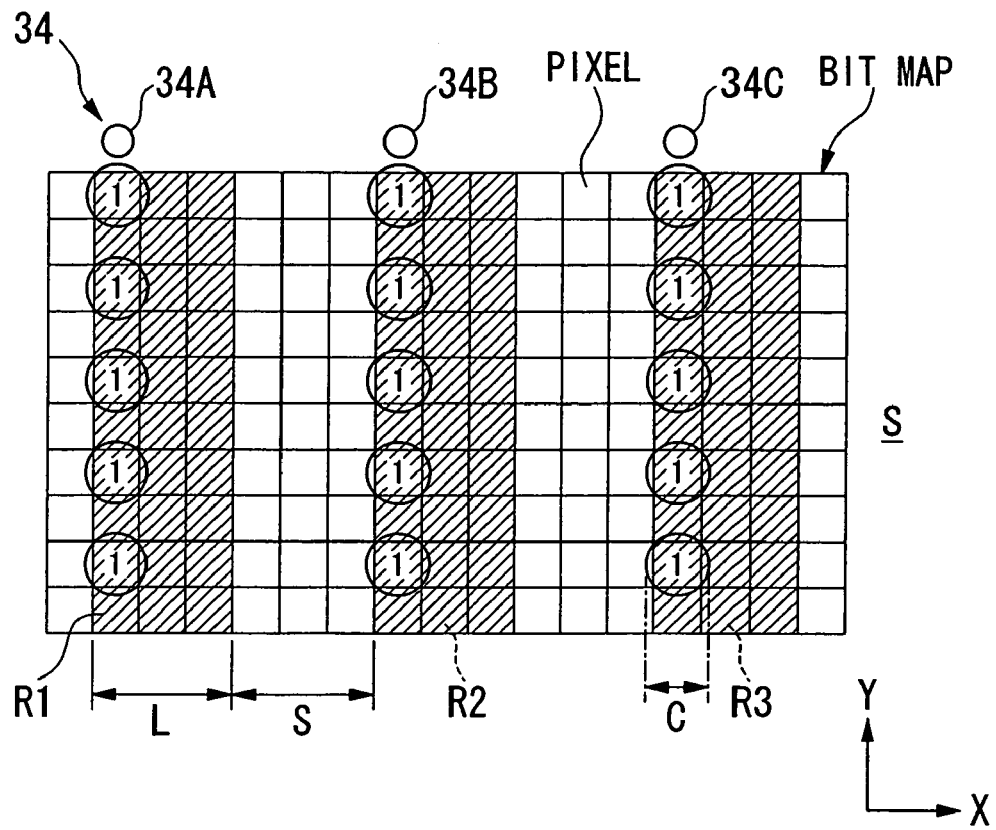
FIGS. 9A and 9B are views for explaining an example for a method for forming a pattern.

As shown in FIG. 9A, liquid drops are disposed simultaneously from the first ejecting nozzle 34A, the second ejecting nozzle 34B, and the third ejecting nozzle 34C such that a space which corresponds to a pixel is formed in the region in which the first end section pattern is supposed to be formed so as to form the first end section patterns Wa in each of regions R1, R2, and R3 for forming the first layer pattern W1, the second layer pattern W2, and the third layer pattern W3 in the first scanning operation. Here, bubbles are removed from the ejecting head 34 in advance before the liquid drops are ejected from the ejection nozzles 34A, 34B, and 34C. Here, the liquid drops which are disposed on the substrate S spread on the substrate S when the liquid drops contact the substrate S. That is, as shown in FIG. 9A, the liquid drop which is ejected on the substrate S spreads such that a diameter of the liquid drop is larger than a pixel. The liquid drops are disposed by a predetermined interval (a space which corresponds to a pixel) in the Y-axis direction; therefore, the liquid drops which are disposed on the substrate S do not overlap each other. By doing this, it is possible to prevent the liquid materials from being disposed excessively on the substrate S in the Y-axis direction; therefore, it is possible to prevent the bulges from occurring.

Here, although the liquid drops are disposed not to overlap each other on the substrate S according to FIG. 9A, more importantly, it is acceptable if the liquid drops are disposed so as to overlap each other slightly. Also, although the liquid drops are disposed such that a space which corresponds to a pixel is formed between the liquid drops, more importantly, it is acceptable if the liquid drops are disposed such that a space which corresponds to a plurality of pixels. In such a case, it should be arranged such that more scanning movements and disposing movements (ejecting movements) of the ejecting head 34 are performed on the substrate S so as to compensate for a space between the liquid drops formed on the substrate.

Also, the predetermined water-repellant treatment is performed on the surface of the substrate S in the steps S2 and S3 in advance; thus, the liquid drops which are disposed hardly spread on the substrate S. Therefore, it is possible to control the pattern shape desirably reliably. It is possible to form a thicker liquid member easily.

Figure 9B:
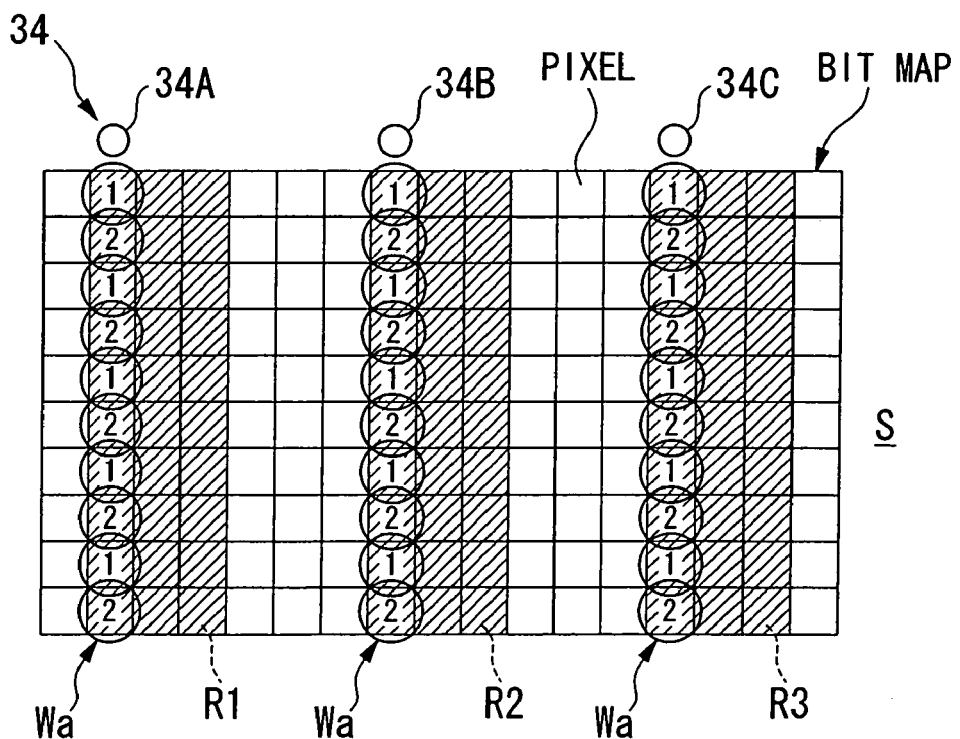

FIG. 9B is a plan view for the liquid drops which are disposed from the ejecting head 34 on the substrate S in the second scanning operation. Here, in FIG. 9B, "2" is added to the liquid drops which are disposed in the second scanning operation. In the second scanning operation, the liquid drops are disposed from the ejecting nozzles 34A, 34B, and 34C simultaneously such that spaces between the liquid drops "1" which are disposed in the first scanning operation should be covered. Thus, the liquid drops are disposed continuously by the first and the second scanning operations. By doing this, the first end section patterns Wa are formed in the regions R1, R2, and R3 for forming the first layer pattern, the second layer pattern, and the third layer pattern. Here, the liquid drops "2" spread on the substrate S when the liquid drops "2" contact the substrate S; thus, a part of the liquid drops "2" and a part of the liquid drops "1" which are previously disposed on the substrate S overlap each other. More specifically, a part of the liquid drops "2" overlap on the liquid drops "1". Here, bubbles are removed from the ejection head 34 in advance before ejecting the liquid member from the ejecting nozzles 34A, 34B, and 34C in the second scanning operation.

Here, it is possible to perform an intermediate drying operation (step 5) so as to remove the dispersion solvent according to necessity after the liquid drops are disposed for forming the first end section pattern Wa on the substrate S. The intermediate drying operation may be a common thermal treatment in which a heating device such as a hot plate, an electric furnace, and a hot wind generating device are used. Also, it is possible to employ an optical treatment in which a lamp annealing method is employed.

Figure 10A:
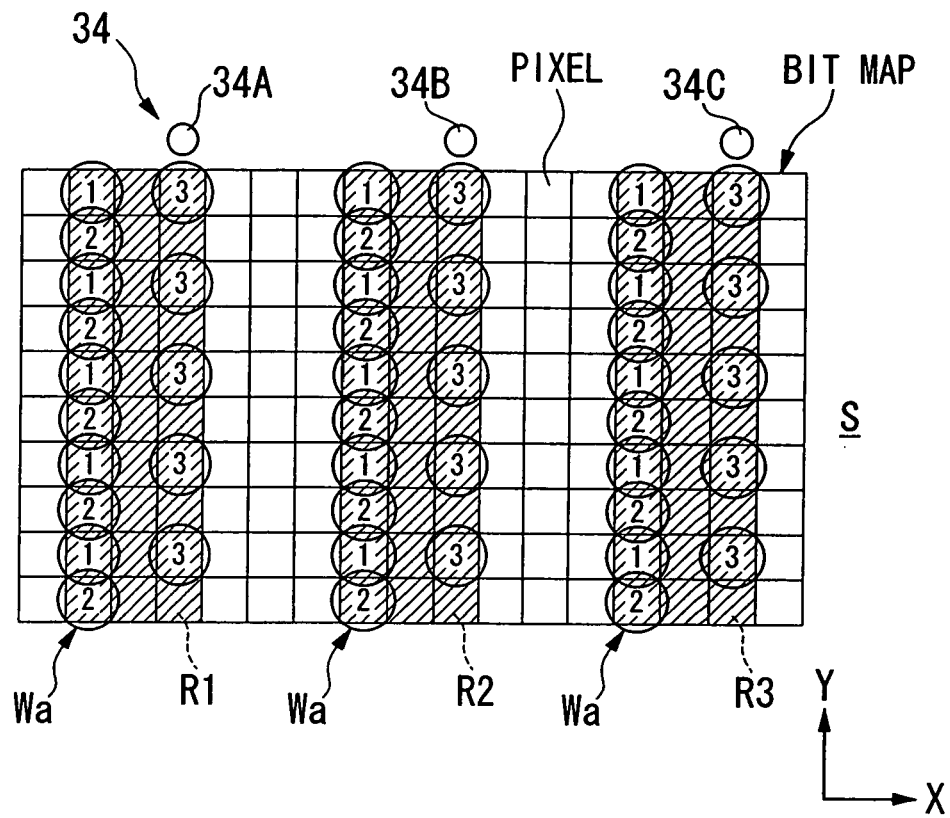
FIGS. 10A and 10B are views for explaining an example for a method for forming a pattern.

Next, the ejecting head 34 and the substrate S move relative in the X-axis direction by a corresponding shift amount to two pixels. Here, the ejecting head 34 moves in a stepped manner toward the substrate S in +X-axis direction by a corresponding shift amount to two pixels. The ejection nozzles 34A, 34B, and 34C move accordingly. Consequently, the ejection head 34 performs the third scanning operation. By doing this, as shown in FIG. 10A, the liquid drops "3" for forming a second end section patterns Wb as a part of the layer patterns W1, W2, and W3 are disposed to the first end section patterns Wa on the substrate S simultaneously from the ejecting nozzles 34A, 34B, and 34C with intervals in the X-axis direction. Here, the liquid drops "3" are disposed so as to have a space which corresponds to a pixel in the Y-axis direction. Here, bubbles are also removed from the ejecting head 34 in advance before the liquid drops are ejected from the ejection nozzles 34A, 34B, and 34C in the third scanning operation.

Figure 10B:
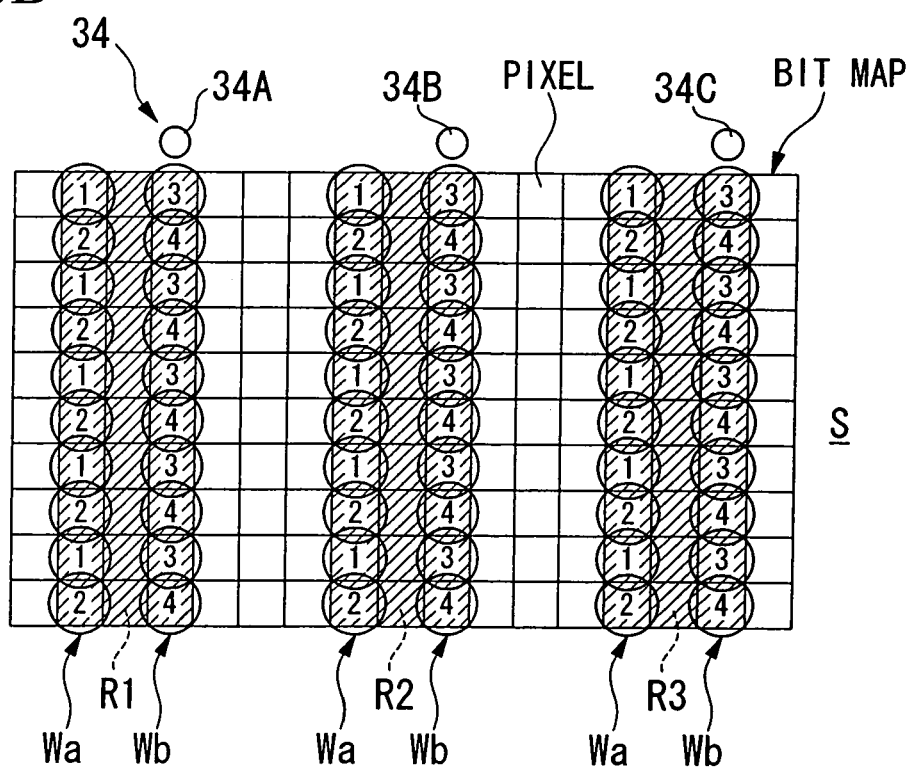
Figure 11A:
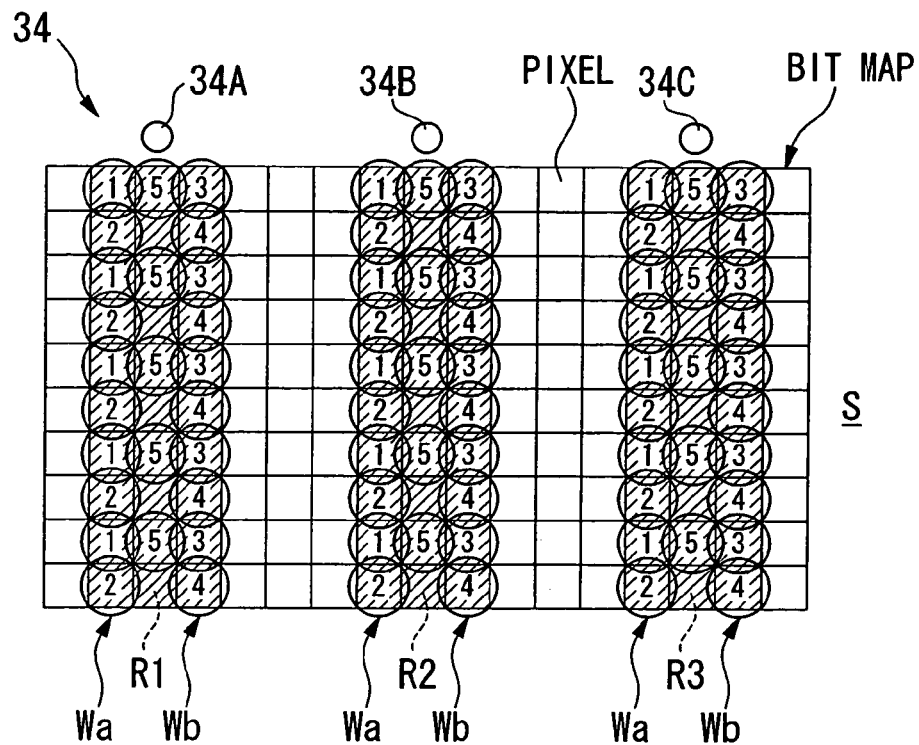
FIGS. 11A and 11B are views for explaining an example for a method for forming a pattern.
Figure 11B:
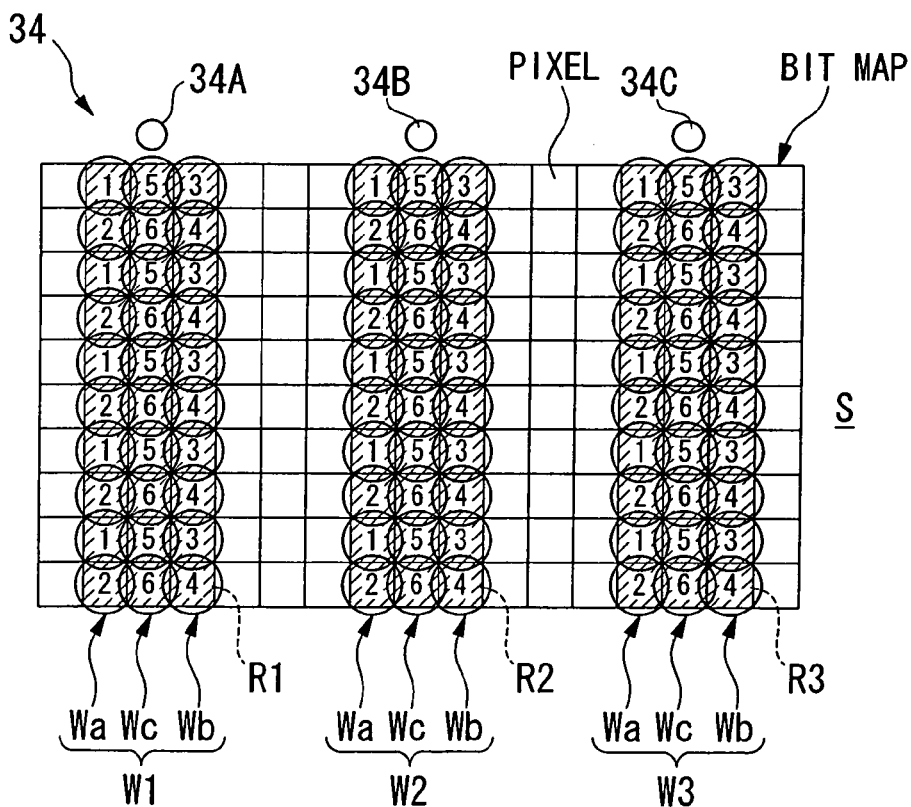

FIG. 10B is a plan view for the liquid drops which are disposed from the ejecting head 34 on the substrate S in the fourth scanning operation. Here, in FIG. 10B, "4" is added to the liquid drops which are disposed in the fourth scanning operation. In the fourth scanning operation, the liquid drops are disposed from the ejecting nozzles 34A, 34B, and 34C simultaneously such that spaces between the liquid drops "3" which are disposed in the third scanning operation should be covered. Thus, the liquid drops are disposed continuously by the third and the fourth scanning operations. By doing this, the second end section patterns Wb are formed in the regions R1, R2, and R3 for forming the layer patterns. Here, a part of the liquid drops "4" and a part of the liquid drops "3" which are previously disposed on the substrate S overlap each other. More specifically, a part of the liquid drops "4" overlap on the liquid drops "3". Here, bubbles are removed from the ejection head 34 in advance before ejecting the liquid member from the ejecting nozzles 34A, 34B, and 34C in the fourth scanning operation.

Here, it is also possible to perform an intermediate drying operation so as to remove the dispersion solvent according to necessity after the liquid drops are disposed for forming the second end section pattern Wb on the substrate S.

Next, the ejecting head 34 moves toward the substrate S by a space which corresponds to a pixel in −X-axis direction. The ejecting nozzles 10A, 10B, and 10C move by a space which corresponds to a pixel in the X-axis direction accordingly. Consequently, the ejecting head 34 performs a fifth scanning operation. By doing this, as shown in FIG. 10A, the liquid drops "5" are disposed on the substrate simultaneously for forming a central pattern Wc which forms a part of the layer patterns W1, W2, and W3 respectively. Here, the liquid drops "5" are disposed so as to form a space which corresponds to a pixel in the Y-axis direction. Here, a part of the liquid drops "5" and a part of the liquid drops "1" and "3" which are previously disposed on the substrate S overlap each other. More specifically, a part of the liquid drops "5" overlap on the liquid drops "1" and the liquid drops "3". Here, bubbles are removed from the ejection head 34 in advance before ejecting the liquid member from the ejecting nozzles 34A, 34B, and 34C in the fifth scanning operation.

FIG. 10B is a plan view for the liquid drops which are disposed from the ejecting head 34 on the substrate S in a sixth scanning operation. Here, in FIG. 10B, "6" is added to the liquid drops which are disposed in the sixth scanning operation. In the sixth scanning operation, the liquid drops are disposed from the ejecting nozzles 10A, 10B, and 10C simultaneously such that spaces between the liquid drops "5" which are disposed in the fifth scanning operation should be covered. Thus, the liquid drops are disposed continuously by the fifth and the sixth scanning operations. By doing this, the central pattern Wc is formed in the regions R1, R2, and R3 for forming the layer patterns. Here, a part of the liquid drops "6" and a part of the liquid drops "5" which are previously disposed on the substrate S overlap each other. More specifically, a part of the liquid drops "6" overlap on the liquid drops "5". Furthermore, a part of the liquid drops "6" overlap on the liquid drops "2" and the liquid drops "4". Here, bubbles are removed from the ejection head 34 in advance before ejecting the liquid member from the ejecting nozzles 34A, 34B, and 34C in the sixth scanning operation.

By doing the above operations, the layer patterns W1, W2, and W3 are formed respectively.

As explained above, the liquid drops are disposed on a plurality of pixels for the regions R1, R2, and R3 for forming the layer patterns by the same disposing order as the order according to which a plurality of liquid drops are disposed sequentially on the regions R1, R2, and R3 for forming the layer patterns W1, W2, and W3 having approximately the same shapes as each other. Therefore, a manner in which the liquid drops "1" to "6" are overlapped becomes the same in the layer patterns W1, W2, and W3 even if a part of the liquid drops "1" to "6" are disposed so as to overlap each other. Therefore, it is possible to form the layer patterns W1, W2, and W3 so as to look alike each other. Therefore, it is possible to prevent unevenness in external views of the layer patterns W1, W2, and W3.

Additionally, the liquid drops are disposed by the same order among the layer patterns W1, W2, and W3; therefore, the disposition of the liquid drops (an overlapping manner of the liquid drops) becomes the same among the layer patterns W1, W2, and W3; thus, it is possible to prevent the uneven external views among the layer patterns W1, W2, and W3.

Furthermore, the overlapping manner of the liquid drops among the layer patterns W1, W2, and W3 are the same as each other; therefore, it is possible to form the layer patterns by approximately the same thickness distribution. Therefore, if the layer pattern is a repeated pattern in which the layer pattern is repeated in a surface direction of the substrate, that is, more specifically, if a plurality of layer patterns are formed so as to correspond to the pixels in the display device, pixels have the same thickness distribution as each other. Therefore, it is possible to realize a common function in each position in a surface direction of the substrate.

Also, the first end section pattern Wa and the second end section pattern Wb are formed, and after that, the liquid drops "5" and the liquid drops "6" are disposed so as to form the central patterns Wc such that the central patterns Wc should cover the spaces between the first end section pattern Wa and the second end section pattern Wb. Therefore, it is possible to form the layer patterns W1, W2, and W3 in approximately the same width as each other. That is, when the liquid drops "1", "2", "3", and "4" for forming the end section patterns. Wa and Wb after the central pattern Wc is formed on the substrate S, there is a phenomenon in which the liquid drops are attracted toward the central pattern Wc which is formed on the substrate S. Thus, there is a case in which it is difficult to control the width of the layer patterns W1, W2, and W3. However, in the present embodiment, the end section patterns Wa and Wb are formed on the substrate S at first, thus, the liqfuid drops "5" and "6" for forming the central pattern Wc are disposed such that spaces between the end section patterns Wa and Wb should be covered. Therefore, it is possible to control the width of the layer patterns W1, W2, and W3 very accurately.

Here, more importantly, it is acceptable if the end section patterns Wa and Wb may be formed after the central pattern Wc is formed. In such a case, the order for disposing the liquid drops is the same as among the layer patterns W1 to W3; therefore, it is possible to prevent the unevenness in the external views among the formed layer patterns.

When a conductive layer wiring pattern (metal wiring pattern) is formed, it is possible to eject the liquid drops desirably by removing bubbles from the ejecting head 34 in advance before ejecting the liquid drops. Therefore, it is possible to form a reliable conductive layer wiring pattern.

Next, a method for manufacturing a microlens is explained for an example for forming the above structural elements.

In this example, as shown in FIG. 12A, liquid drops 22a which is made of an optical transmitting resin are ejected from the ejecting head 34 in the above ejecting device so as to apply thereon. Here, bubbles are removed from the ejecting head 34 in advance before the liquid drops 22a are ejected from the ejection head 34.

If a microlens is used for an optical layer for a purpose of a screening operation, an optical transmitting sheet or an optical transmitting film which are made of a cellulose resin such as acetic acid cellulose or propyl cellulose, and a transparent resin (optical transmitting resin) such as polyvinyl chloride, polyethylene, polypropylene and polyester. are preferably used for the substrate S. Also, it is possible to use a substrate which is made of a transparent material (optical transmitting material) such as glass, polycarbonate, polyarilate, polyether sulfone, amorphous polyolefin, polyethylene terephthalate, polymethylmethacrylat.

For an optical transmitting resin, it is possible to name a thermoplastic resin or a thermosetting resin such as an acryl resin such as polymethylmetacrylat, polyhydroxyethylmetacrylat, polycyclohexylmetacrylat, allyl resin such as polydiethyleneglycolbisallylcarbonate, polycarbonate, methacrylic resin, polyurethane resin, polyester resin, polyvinyl chloride resin, polyacetic acid vinyl resin, cellulose resin, polyamide resin, fluoride resin, polypropylene resin and polystyrene resin. Otherwise, more than one of the above resins may be used.

Here, in the present example, a radiation curable optical transmitting resin is used particularly. The radiation curable resin is made by mixing a photopolymerization starter such as a biimidazole compound in the above optical transmitting resin; thus, the radiation curable resin is provided with a radiation curable characteristic. Here, the radiation is a general term which indicates various rays such as a visible radiation, an ultraviolet ray, extreme ultraviolet ray, an X-rays, and electron beams. Here, the ultraviolet ray is used commonly.

More than one radiation curable liquid drop 22a which is made of an optical transmitting resin is ejected on the substrate S according to a desirable size of a microlens. Accordingly, the optical transmitting resin 23 which is formed by the liquid drops 22 is formed in a concave shape (approximate half spherical shape) due to its surface tension as shown in FIG. 12A. By doing this, a predetermined amount of the optical transmitting resin is ejected to a microlens to be applied thereon. Furthermore, such an applying operation is performed for forming a desirable quantity of microlenses. After that, a radiation such as an ultraviolet ray is ejected on these optical transmitting resin 23. These optical transmitting resins 23 are cured as shown in FIG. 12B; thus, a cured member 23a is obtained. Here, a quantity of a droplet of the liquid drop 22a which is ejected from the ejecting head 34 depends on an ejecting head 34 and an ejected ink material. Usually, a quantity of a droplet of the liquid drop 22a which is ejected from the ejecting head 34 is in a range of 1 pL to 20 pL. Desirable quantity of liquid drops 22b in which numerous optical dispersing particles 26 are dispersed are ejected on cured members 23a from the ejecting head 34 as shown in FIG. 12C; thus, the liquid drops 22b adhere on a surface of the cured members 23a. For such an optical dispersing particle 26, it is possible to name a particle such as silica, alumina, titania, calcium carbonate, aluminium hedroxide, acrylic resin, organic silicon resin, polystyrene, urea resin, formaldehyde condensation product. For such an optical dispersing particle 26, one of the above material is used, or a plurality of the above materials are used in a combined manner. If such an optical dispersing particle 26 is an optical transmitting particle, it is necessary that a refractive index in the optical transmitting resin should be sufficiently different from the refractive index of the optical dispersing particle 26 so as to realize a sufficient optical dispersion. Therefore, if the optical dispersing particle 26 is an optical transmitting particle, the optical dispersing particle 26 is preferably selected according to the optical transmitting resin which is supposed to be used so as to satisfy the above condition.

Such optical dispersing particles 26 are adjusted to be an ink which can be ejected from the ejecting head 34 by dispersing the optical dispersing particles 26 in an appropriate solvent (for example, a solvent which is used for an optical transmitting resin). In such a case, it is preferable that a surface treatment such as a coating should be performed on a surface of the optical dispersing particle 26 by a surface-active agent, or the optical dispersing particle 26 should disperse in the solvent more easily by performing a coating operation by a melt resin. By performing such a surface treatment, more desirable liquidity can be added to the optical dispersing particle 26 such that the optical dispersing particle 26 can be ejected from the ejecting head 34 more easily. Here, for a surface-active agent for performing the surface treatment, a surface-active agent containing cation, anion, nonion, ampho-ion, silicon, or fluorine is selected so as to be used preferably according to the optical dispersing particle 24.

Also, a grain diameter of the optical dispersing particle 26 should be in a range of 200 nm to 500 nm. According to such a range of grain diameter, an optical dispersion can be realized preferably because the grain diameter is not smaller than 200 nm. Also, it is possible to eject the optical dispersing particle 26 from nozzles in the ejecting head 34 desirably because the grain diameter is not greater than 500 nm.

Here, it is acceptable if the liquid drop 22b which is made by dispersing the optical dispersing particle 26 therein may be ejected by the ejecting head 34 which ejects the liquid drop 22a made of an optical transmitting resin. Also, it is acceptable if other ejecting head may be used. If the ejecting head 34 is used commonly, it is possible to form an overall device including the ejecting head 34 simply. If the liquid drop 22b and the liquid drop 22a are ejected from different ejecting heads respectively, both head can be used exclusively for each ink (an optical transmitting resin ink and an ink made of the optical dispersing particle 24). Therefore, it is not necessary to clean the ejecting heads when the applied ink is switched; thus, it is possible to improve a productivity.

After that, the solvent in the liquid drop 22b in which the optical dispersing particle 24 is dispersed is vaporized by performing a thermal treatment, a decompressing treatment, or a thermal decompressing treatment. Consequently, a surface of the cured member 23a becomes softened by the solvent in the liquid drop 22b, and the optical dispersing particle 26 is adhered on the softened surface of the cured member 23a. Therefore, the solvent is vaporized. Also, along with a hardening on the surface of the cured member 23, the optical dispersing particle 24 is fixed on a surface of the optical transmitting resin cured member 23a. Thus, it is possible to form a microlens 25 of the present invention on a surface of which the optical dispersing particle 24 is dispersed as shown in FIG. 12D, by fixing the optical dispersing particle 24 on a surface of the cured member 23a.

It is possible to eject the liquid drops 22a and 22b desirably by removing bubbles from the ejecting head 34 in advance before liquid drops are ejected according to a method for manufacturing such a microlens 25; therefore, it is possible to form a reliable microlens 25.

Also, a convex (approximately half spherical) microlens 25 which is made of the optical transmitting resin 23 and the optical dispersing particle 24 is formed according to an ink jet method; therefore, it is not necessary to use a molding die which is supposed to be used in a die-casting method or an injection-molding method. Also, there is approximately no material loss. Therefore, it is possible to reduce a manufacturing cost. Also, the microlens 25 is a convex (approximately half spherical) microlens; therefore, it is possible to disperse a light approximately uniformly over a wide range of perspective angle (direction) as wide as 360°. In addition, it is possible to form a microlens having a high optical dispersion because the optical dispersing particle 26 is used in a complex manner.

Next, a method for manufacturing an image display device which is provided with an electron discharging element is explained for an example for the above structural elements.

Figure 13A:
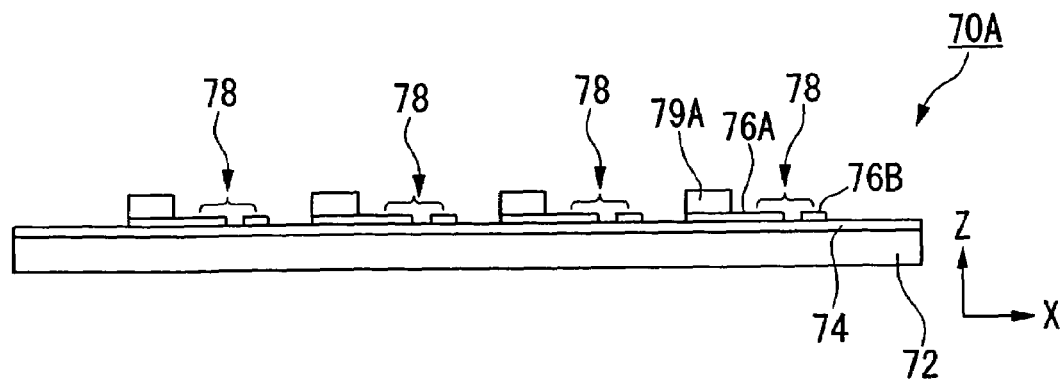
FIGS. 13A and 13B show an electronic raw substrate for an image display device.
Figure 13B:
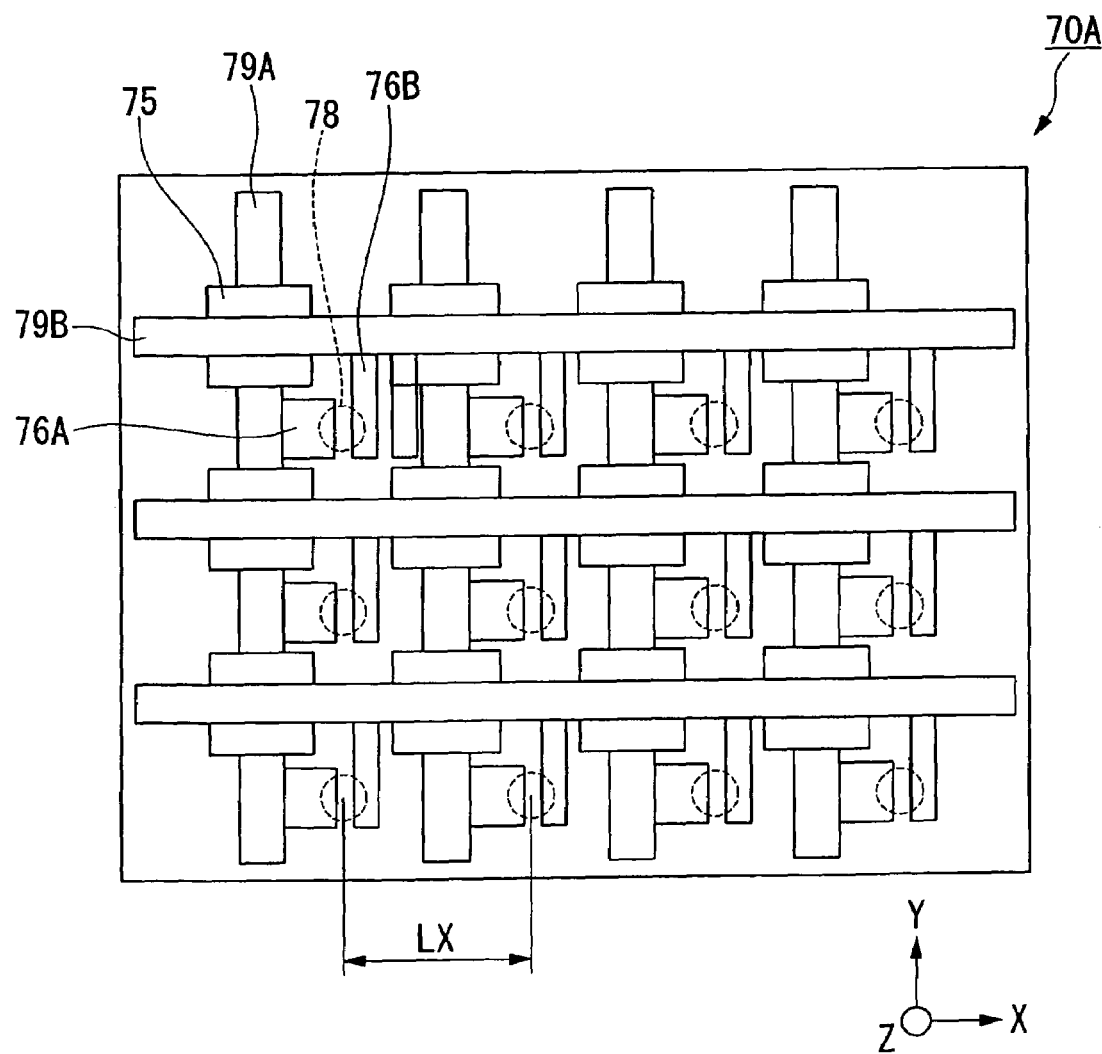

A base member 70A shown in FIGS. 13A and 13B is a substrate which is supposed to be an electron source substrate 70B in the image display device in which a part of the structural element is formed by performing a treatment by the above ejecting device 30. The base member 70A is provided with a plurality of sections 78 which are disposed in matrix for receiving an ejection.

More specifically, the base member 70A comprises a substrate 72, a layer 74 formed on the substrate 72 for preventing a sodium from dispersing, a plurality of element electrodes 76A and 76B which are disposed on the layer 74 for preventing a sodium from dispersing, a plurality of metal wirings 79A which are disposed on a plurality of element electrodes 76A, and a plurality of metal wirings 79b which are disposed on a plurality of element electrodes 76B. Each one of a plurality of the metal wirings 79A expand in the Y-axis direction. Each one of a plurality of the metal wirings 79B expand in the X-axis direction. An insulating layer 75 is formed between the metal wiring 79A and the metal wiring 79B; therefore, the metal wiring 79A and the metal wiring 79B are insulated electrically from each other.

A section which includes a pair of the element electrodes 76A and element electrodes 76B correspond to a pixel region. A pair of the element electrodes 76A and element electrodes 76B are disposed so as to face each other on the layer 74 for preventing a sodium from dispersing with a predetermined interval. A element electrode 76A which corresponds to a certain pixel region is connected to a corresponding metal wiring 79A electrically. Also, an element electrode 76B which corresponds to the pixel region is connected to a corresponding metal wiring 79B electrically. Here, in the present specification, a section in which the substrate 72 and the layer 74 for preventing a sodium from dispersing are attached may be indicated as a supporting substrate.

In each pixel region in the base member 70A, a part of the element electrode 76a, a part of element electrode 76B, and the layer 74 for preventing a sodium from dispersing which is exposed between the element electrode 76a and the element electrode 76B correspond to the sections 78 for receiving an ejection. More specifically, a conductive thin layer 411F (see FIG. 14B) should be formed in the sections 78 for receiving an ejection. The conductive thin layer 411F is formed so as to cover a part of the element electrode 76A, a part of the element electrode 76B, and a gap which is formed between the element electrodes 76A and 76B. As shown in FIG. 13B, the sections 78 for receiving an ejection is formed in a circular shape in the present example.

The base member 70A shown in FIG. 13B is disposed in parallel with a virtual plane which is defined with reference to the X-axis direction and the Y-axis direction. Additionally, a longitudinal direction in a matrix which is formed by a plurality of the sections 78 for receiving an ejection is indicated by the X-axis direction. Also, a latitudinal direction in a matrix which is formed by a plurality of the sections 78 for receiving an ejection is indicated by the Y-axis direction. The sections 78 for receiving an ejection are disposed in arrays periodically in the X-axis direction on the base member 70A in such an order. Furthermore, the sections 78 for receiving an ejection are disposed in a line with a predetermined interval in the Y-axis direction. An interval LRX in the X-axis direction between the sections 78 for receiving an ejection is approximately 190 µm. The above interval between the sections 78 for receiving an ejection and the size of the sections 78 for receiving an ejection correspond to an interval between the pixel regions in a High-Fidelity television having 40 inch-diagonal size.

The above ejecting device 30 corresponds to each of the sections 78 for receiving an ejection respectively in the base member 70A shown in FIGS. 13A and 13B so as to eject the liquid material (liquid member) such as a material 411 for forming the conductive thin layer. For such a material for forming the conductive thin layer material 411, for example, an organic palladium solvent is used.

In order to manufacture an image display device by using the ejecting device 30, first, the layer 74 for preventing a sodium from dispersing of which main component is a silicon dioxide ($SiO_2$) are formed on the substrate 72 which is formed by a soda glass. More specifically, the layer 74 for preventing a sodium from dispersing are formed by forming an $SiO_2$ layer having 1 µm on the substrate 72 by a sputtering method. Next, a titanium layer having 5 nm of thickness is formed on the layer 74 for preventing a sodium from dispersing by a sputtering method or a vacuum deposition method. Consequently, a plurality of pairs of the element electrodes 76a and the element electrodes 76B are formed from the titanium layer so as to be separated by a predetermined distance from each other by a photolithographic method and an etching method. After that, a plurality of metal wirings 79A which expand in the Y-axis direction are formed by applying a silver (Ag) paste on the layer 74 for preventing a sodium from dispersing and a plurality of the element electrodes 76A so as to sinter thereof by using a screen printing method. Next, an insulating layer 75 is formed by applying a glass paste on a part of the metal wirings 79A and sintering therefor by a screen printing method. Consequently, Ag paste is applied on the layer 74 for preventing a sodium from dispersing and a plurality of element electrodes 76B so as to be sintered by the screen printing method; thus, a plurality of metal wirings 79B which expand in the X-axis direction are formed. Here, Ag paste is applied such that the metal wiring 79B crosses the metal wiring 79A via the insulating layer 75 when the metal wirings 79B are manufactured. According to the above manufacturing steps, a base member 70A is formed as shown in FIGS. 13A and 13B.

Next, a lyophilic treatment is performed on the base member 70A by performing an oxygen plasma treatment under an atmospheric pressure condition. By doing this, a part of the element electrode 76a, a part of element electrode 76B, and a surface of the supporting substrate which is exposed between the element electrode 76a and the element electrode 76B become lyophilic. Thus, these surfaces become the sections 78 for receiving an ejection. Here, a surface which has a desirable lyophilic characteristics can be formed according to the used material sometimes even if such surface treatment is not performed. In such a case, a part of the element electrode 76a, a part of element electrode 76B, and a surface of the layer 74 for preventing a sodium from dispersing which are exposed between the element electrode 76a and the element electrode 76B become the sections 78 for receiving an ejection even if the above treatment is not performed.

Figure 14A:
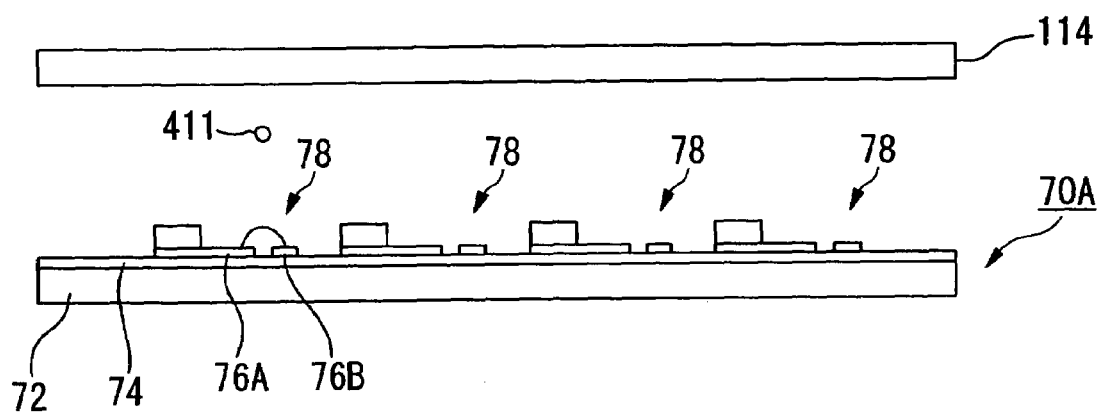
FIGS. 14A to 14C are views for explaining a manufacturing process for the image display device.

The base member 70A on which the sections 78 for receiving an ejection are formed is transported to a stage 106 in the ejecting device 30 by a transporting device 470. Consequently, the ejecting device 30 ejects a material 411 for forming the conductive thin layer from the ejecting head 34 such that the conductive thin layer 411F should be formed on the entire sections 78 for receiving an ejection as shown in FIG. 14A. Here, bubbles are removed from the ejection head 34 in advance before ejecting the material 411 for forming the conductive thin layer.

In the present example, the liquid drop is ejected from the ejecting head 34 such that a diameter of the liquid drop for a material for forming the conductive thin layer which contact the sections 78 for receiving an ejection should be in a range of 60 µm to 80 µm. In case in which a layer of the material 411 for forming the conductive thin layer is formed on an entire sections 78 for receiving an ejection in the base member 70A, the transporting device 470 disposes the base member 70a in a drying device 450. A conductive thin layer 411F of which main component is a palladium oxide is formed on the sections 78 for receiving an ejection by drying the material 411 for forming the conductive thin layer on the sections 78 for receiving an ejection completely. By doing this, a conductive thin layer 411F is formed in each pixel region so as to cover a part of the element electrode 76a, a part of element electrode 76B, and the layer 74 for preventing a sodium from dispersing which are exposed between the element electrode 76a and the element electrode 76B.

Next, an electron discharging section 411D is formed in a part of the conductive thin layer 411F by charging a predetermined voltage of pulse electricity between the element electrode 76A and the element electrode 76B. Here, it is preferable that an electricity is charged between the element electrode 76A and the element electrode 76B under an organic atmospheric condition and a vacuum condition respectively. It is because the electron can be discharged from the electron discharging section 41 ID more efficiently. The element electrode 76A, the corresponding element electrode 76B, and the conductive thin layer 411F in which the electron discharging section 411D are electron discharging elements. Also, each electron discharging element corresponds to each pixel region.

Figure 14B:
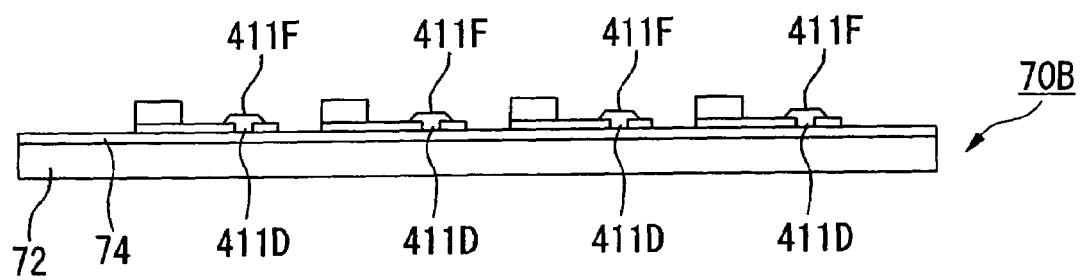

According to the above manufacturing steps as shown in FIG. 14B, the base member 70A is formed to be an electron source substrate 70B.

Figure 14C:
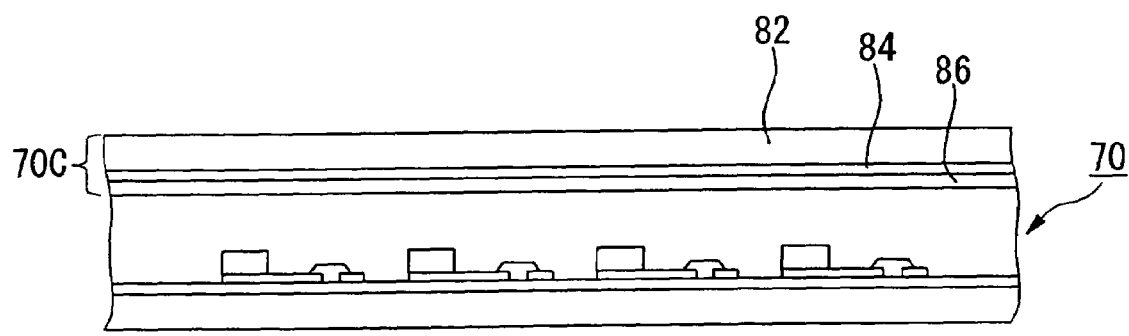

Next, an image display device 70 which is provided with an electron discharging element can be formed by attaching the electron source substrate 70b and a front substrate 70C according to a commonly know method as shown in FIG. 14C. The front substrate 70C comprises a glass substrate 82, a plurality of fluorescent sections 84 which are disposed on the glass substrate 82 in matrix manner, and a metal plate 86 which covers a plurality of fluorescent sections 84. The metal plate 86 serves as an electrode for accelerating an electron beam which is emitted from the electron discharging section 411D. The electron source substrate 70B and the front substrate 70C are positioned such that a plurality of electron discharging elements should be disposed so as to face a plurality of fluorescent sections 84. A space between the electron source substrate 70B and the front substrate 70C is maintained under a vacuum condition.

According to a method for manufacturing the image display device which is provided with such an electron discharging elements, it is possible to eject the material 411 for forming the conductive thin layer desirably by removing bubbles from the ejecting head 34 in advance before the liquid drops are ejected. Therefore, it is possible to form a reliable image display device.

Next, an example for an electronic apparatus in which a part of the structural elements are formed by the above ejecting device is explained.

Figure 15:
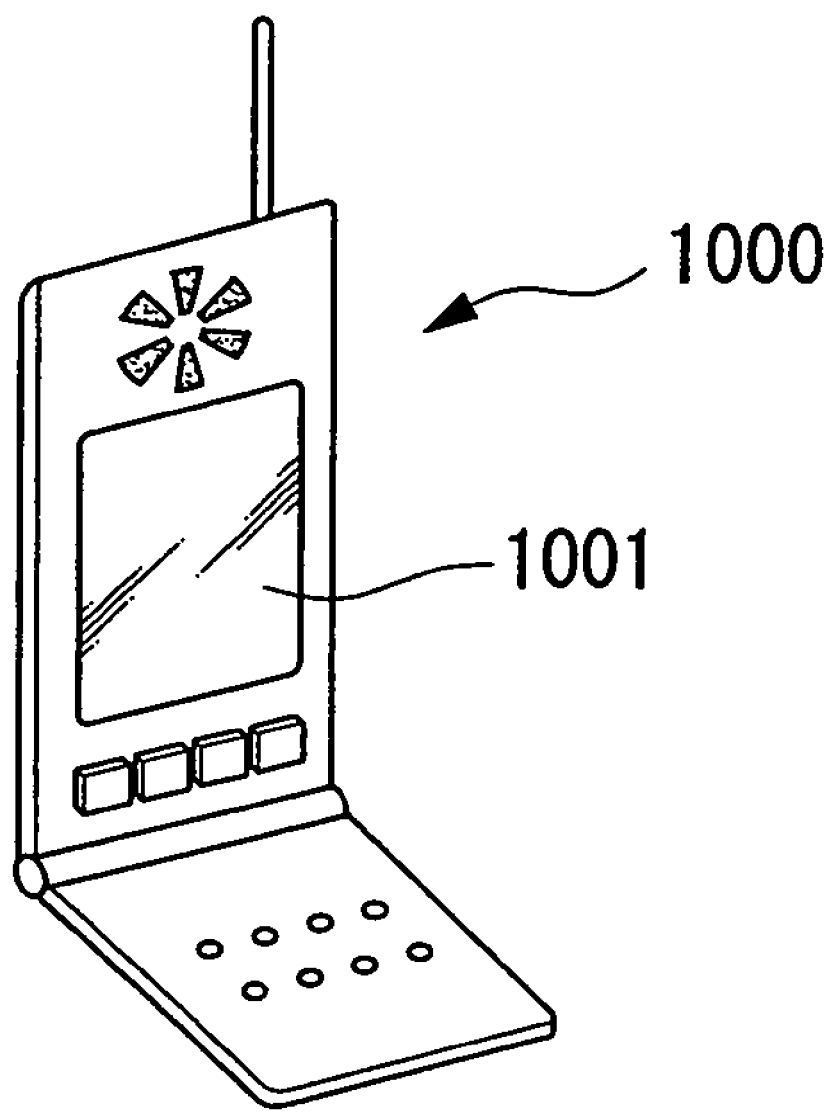
FIG. 15 is a perspective view for an example for an electronic apparatus.

FIG. 15 is a perspective view for a motile phone as an example for such an electronic apparatus. In FIG. 15, reference numeral 1000 indicates a mobile phone unit. Reference numeral 1001 indicates a display section in which the above organic EL element (organic EL device 301) is used.

The electronic apparatus shown in FIG. 15 is provided with the display section 1001 which is made of the above organic EL elements. Therefore, it is possible to reduce a manufacturing cost in the display section 1001. Also, it is possible to form the structural elements in the display section 1001.

What is claimed is:
1. A liquid member ejecting device comprising:
an ejecting head having a plurality of cavities for storing a liquid member and a plurality of nozzles communicating with the cavities;
a plurality of ejecting sections for ejecting the liquid member which is stored in the plurality of the cavities from the nozzles;
a liquid member tank for storing the liquid member so as to supply the liquid member to the ejecting head;
a first sucking member covering at least the nozzles disposed on a surface of the ejecting head in an air-tight manner;

a first depressurizing section connected to the first sucking member to depressurize an inside of the ejecting head via the first sucking member;

a second sucking member covering at least the nozzles disposed on the surface of the ejecting head in air-tight manner; and a second depressurizing section separate from the first depressurizing section and connected to the second sucking member and communicating with the liquid member tank so as to depressurize the inside of the ejecting head with the second sucking member and depressurize an inside of the liquid member tank.

2. A liquid member ejecting device according to claim 1, further comprising a liquid member sensor, disposed opposite to the ejecting head in the first sucking member, for detecting flow of the liquid member from the nozzles.

3. A liquid member ejecting device according to claim 1, wherein the liquid member tank has a heater for heating the liquid drop stored in the liquid member tank.

4. A liquid member ejecting device comprising:
an ejecting head having a plurality of cavities for storing a liquid member and a plurality of nozzles communicating with the cavities;
a plurality of ejecting sections for ejecting the liquid member which is stored in the plurality of the cavities from the nozzles;
a liquid member tank for storing the liquid member so as to supply the liquid member to the ejecting head;
a first sucking member for covering the nozzles which covers at least the nozzles disposed on a surface of the ejecting head in an air-tight manner;
a first depressurizing section which is connected to the first sucking member so as to depressurize an inside of the ejecting head via the first sucking member;
a second sucking member for covering the nozzles which covers at least the nozzles, disposed on the surface of the ejecting head in air-tight manner; and
a second depressurizing section connected to the second sucking member and communicating with the liquid member tank so as to depressurize the inside of the ejecting head with the second sucking member and depressurize an inside of the liquid member tank;
wherein the second sucking member is at least a chamber for containing the ejecting head.

5. A liquid member ejecting device according to claim 4, wherein the second depressurizing section depressurizes the inside of the chamber for containing the ejecting head at the same pressure as the pressure inside of the liquid member tank.

6. A liquid member ejecting device according to claim 1, wherein the first sucking member and the second sucking member are formed by a same sucking material, and the first depressurizing section and the second depressurizing section are the same.

7. A method for ejecting a liquid member by using a liquid member ejecting device comprising:
an ejecting head having a plurality of cavities for storing the liquid member and a plurality of nozzles communicating with the cavities;
a plurality of ejecting sections for ejecting the liquid member stored in the cavities from the nozzles;
a liquid member tank for storing the liquid member so as to supply the liquid member to the ejecting head;
a first sucking member for covering at least the nozzles in an air-tight manner formed on a nozzle forming surface on the ejecting head;
a first depressurizing section connected to the first sucking member for depressurizing an inside of the ejecting head with the first sucking member;
a second sucking member for covering at least the nozzles in an air-tight manner formed on the nozzle forming surface of the ejecting head; and
a second depressurizing section separate from the first depressurizing section and connected to the second sucking member and communicating with the liquid member tank for depressurizing an inside of the ejecting head with the second sucking member and depressurizing an inside of the liquid member tank,
the method comprising:
covering the nozzles, formed on the nozzle forming surface on the ejecting head, with the first sucking member;
depressurizing the inside of the ejecting head with the first depressurizing section via the first sucking member so as to fill the liquid member in the ejecting head;
filling the liquid member in the ejecting head so as to cover the covered nozzles, formed on the nozzle forming surface of the ejecting head, with the second sucking member;
depressurizing the inside of the liquid member tank with the second depressurizing section so as to depressurize the inside of the ejecting head with the second sucking member; and
depressurizing the inside of the ejecting head so as to eject the liquid member from the ejecting head.

* * * * *